(12) United States Patent
Tayu

(10) Patent No.: US 7,889,110 B2
(45) Date of Patent: Feb. 15, 2011

(54) ANALOG/DIGITAL CONVERTER AND INFORMATION RECORDING AND REPRODUCING APPARATUS

(75) Inventor: Kenichi Tayu, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/331,119

(22) Filed: Dec. 9, 2008

(65) Prior Publication Data

US 2009/0153387 A1 Jun. 18, 2009

(30) Foreign Application Priority Data

Dec. 13, 2007 (JP) ............................. 2007-322461

(51) Int. Cl.
*H03M 1/36* (2006.01)
(52) U.S. Cl. .................. 341/159; 341/118; 341/160
(58) Field of Classification Search .................. 341/159
See application file for complete search history.

(56) References Cited

U.S. PATENT DOCUMENTS

| 4,596,978 | A | * | 6/1986 | Fujita | 341/159 |
|---|---|---|---|---|---|
| 4,897,657 | A | * | 1/1990 | Brubaker | 341/159 |
| 5,029,305 | A | * | 7/1991 | Richardson | 341/159 |
| 5,959,564 | A | * | 9/1999 | Gross, Jr. | 341/160 |
| 6,034,631 | A | * | 3/2000 | Gross, Jr. | 341/160 |
| 6,222,476 | B1 | * | 4/2001 | Lee et al. | 341/159 |
| 6,388,602 | B1 | * | 5/2002 | Yang | 341/159 |
| 6,459,394 | B1 | * | 10/2002 | Nadi et al. | 341/120 |
| 7,327,292 | B2 | * | 2/2008 | Lee et al. | 341/94 |

FOREIGN PATENT DOCUMENTS

JP 08-088174 4/1996

* cited by examiner

*Primary Examiner*—Khai M Nguyen
(74) *Attorney, Agent, or Firm*—Robert J. Depke; Rockey, Depke & Lyons, LLC

(57) ABSTRACT

The present invention provides an A/D converter includes: a plurality of comparators for comparing a plurality of respective standard voltages with an analog input value for a magnitude thereof, the comparators being arranged depending on magnitudes of the standard voltages; a logic boundary detector for detecting a logic boundary point where output signals from the comparators change from one level to another level; and a plurality of majority circuits for being supplied with the output signals from the comparators and determining output signals based on a majority vote on the output signals from the comparators, the majority circuits having logic threshold values adjusted for respective input terminals thereof which are supplied with the output signals from the comparators.

7 Claims, 15 Drawing Sheets

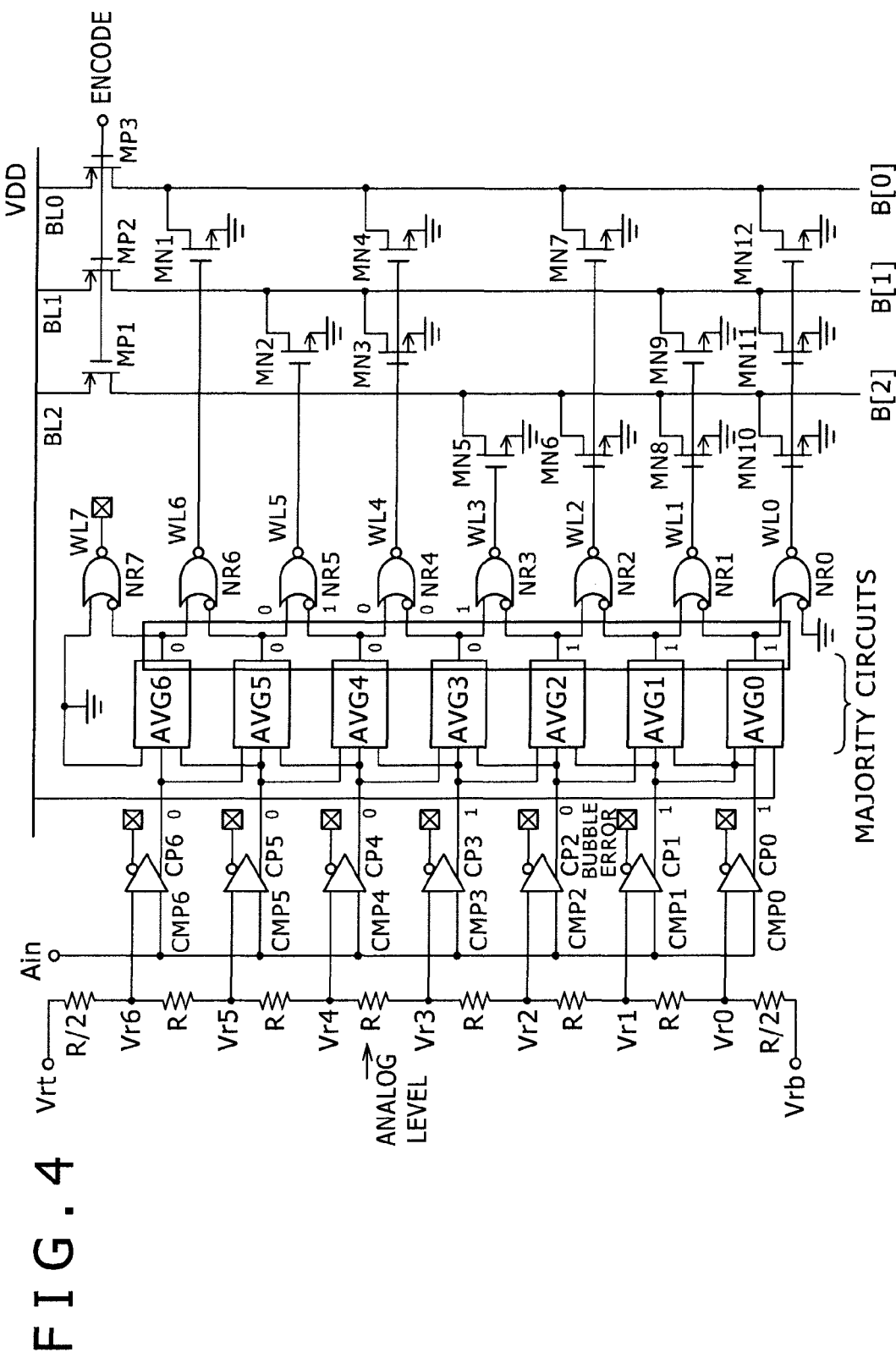
F I G. 4

Out=In0*In1+In1*In2+In2*In0

ANALOG/DIGITAL CONVERTER AND INFORMATION RECORDING AND REPRODUCING APPARATUS

CROSS REFERENCES TO RELATED APPLICATIONS

The present invention contains subject matter related to Japanese Patent Application JP 2007-322461, filed in the Japan Patent Office on Dec. 13, 2007, the entire contents of which being incorporated herein by reference.

BACKGROUND OF THE INVENTION

1. Field of the Invention

The present invention relates to an analog/digital (A/D) converter and an information recording and reproducing apparatus.

2. Description of the Related Art

Recently, A/D converters have being finding use in various electronic devices. For example, Japanese Patent Laid-open No. Hei 11-88174 (hereinafter referred to as Patent Document 1) discloses an A/D converter having a function to correct a bubble error contained in a thermometer code input thereto for the purpose of increasing the operating speed.

SUMMARY OF THE INVENTION

However, A/D converters may cause an error due to a metastable state of a comparator output in addition to a bubble error which is representative of an inverted output logic. The metastable state is a state wherein a comparator outputs an intermediate potential if an input signal and a comparison signal that are supplied to the comparator are relatively close to each other. Particularly, high-speed comparators which are unable to have a sufficient time for comparison are likely to suffer such a metastable state. When a comparator is in a metastable state, its output value tends to suffer an error because it can be judged as either "0" or "1."

The A/D converter disclosed in the above Patent Document 1 is problematic in that its output signal tends to contain an error due to a metastable state because the A/D converter does not prepare itself for the correction of an error caused by a metastable state. Particularly, the A/D converter finds it difficult to correct errors when its output signal contains both a bubble error and an error caused by a metastable state.

It is desirable for the present invention to provide an A/D converter and an information recording and reproducing apparatus which are capable of reliably preventing an error caused by a metastable state of a comparator.

According to an embodiment of the present invention, there is provided an A/D converter including a plurality of comparators for comparing a plurality of respective standard voltages with an analog input value for a magnitude thereof, the comparators being arranged depending on magnitudes of the standard voltages, a logic boundary detector for detecting a logic boundary point where output signals from the comparators change from one level to another level, and a plurality of majority circuits for being supplied with the output signals from the comparators and determining output signals based on a majority vote on the output signals from the comparators, the majority circuits having logic threshold values adjusted for respective input terminals thereof which are supplied with the output signals from the comparators.

The comparators which are arranged depending on magnitudes of the standard voltages compare a plurality of respective standard voltages with an analog input value for a magnitude thereof. The logic boundary detector detects a logic boundary point where output signals from the comparators change from one level to another level. The majority circuits are supplied with the output signals from the comparators and determines output signals based on a majority vote on the output signals from the comparators. The majority circuits have logic threshold values adjusted for respective input terminals thereof which are supplied with the output signals from the comparators. The majority circuits can thus have the logic threshold values designed optimally for respective input terminals thereof which are supplied with the output signals from the comparators. Even if the comparators suffer a bubble error and an error due to a metastable state, the output signals from the comparators are prevented from having a plurality of logic boundary points.

Each of the majority circuits may includes a plurality of metal oxide semiconductor (MOS) transistors, and each of the logic boundary values may be adjusted by changing the ratio of a channel width to a channel length of one of the MOS transistors. With this arrangement, since each of the logic boundary values can be adjusted only by changing the ratio of a channel width to a channel length of one of the MOS transistors, the logic boundary values can easily be adjusted simply by slightly changing a fabrication process for the MOS transistors.

Each of the majority circuits may have three terminals which are supplied with respective output signals from three of the comparators, the logic threshold value for one of the three terminals which is supplied with the output signal from one of the three comparators which has an intermediate one of the standard voltages may serve as a standard threshold value, the logic threshold value for one of the remaining two terminals which is supplied with the output signal from one of the remaining two comparators may be set to a level lower than the standard threshold value, and the logic threshold value for the other of the remaining two terminals which is supplied with the output signal from the other of the remaining two comparators may be set to a level higher than the standard threshold value. With this arrangement, the logic threshold value for one of the three terminals which is supplied with the output signal from one of the three comparators which has an intermediate one of the standard voltages serves as a standard threshold value, the logic threshold value for one of the remaining two terminals which is supplied with the output signal from one of the remaining two comparators is set to a level lower than the standard threshold value, and the logic threshold value for the other of the remaining two terminals which is supplied with the output signal from the other of the remaining two comparators is set to a level higher than the standard threshold value. Consequently, the output signals from the majority circuits can be adapted to an incremental or decremental direction of the standard voltages, and hence can be prevented from having a plurality of logic boundary points.

Each of the majority circuits may include a selector having terminals for being supplied with the output signals from the remaining two comparators, the terminals of the selector being switchable around depending on a high-order bit or a low-order bit of the output signals from the comparators. Since the terminals of the selector are switched around depending on a high-order bit or a low-order bit of the output signals from the comparators, the A/D converter as it is used for a cyclic thermometer code is prevented from suffering a bubble error and an error due to a metastable state.

Each of the majority circuits may includes a plurality of MOS transistors, and each of the logic boundary values is adjusted by changing the ratio of a channel width to a channel length of one of the MOS transistors. With this arrangement, since each of the logic boundary values can be adjusted only by changing the ratio of a channel width to a channel length of one of the MOS transistors, the logic boundary values can easily be adjusted simply by slightly changing a fabrication process for the MOS transistors.

According to an embodiment of the present invention, there is also provided an information recording and reproducing apparatus including an optical pickup for applying a light beam to a track on an optical recording medium, the optical pickup having a photodetector for detecting a light beam reflected from the optical recording medium, and a reproducing circuit for acquiring a reproduced signal from a signal representing the detected light beam from the photodetector. The reproducing circuit includes an A/D converter which includes a plurality of comparators for comparing a plurality of respective standard voltages with an analog input value for a magnitude thereof, the comparators being arranged depending on magnitudes of the standard voltages, a logic boundary detector for detecting a logic boundary point where output signals from the comparators change from one level to another level, and a plurality of majority circuits for being supplied with the output signals from the comparators and determining output signals based on a majority vote on the output signals from the comparators, the majority circuits having logic threshold values adjusted for respective input terminals thereof which are supplied with the output signals from the comparators.

The optical pickup applies a light beam to a track on an optical recording medium, and the photodetector detects a light beam reflected from the optical recording medium. The reproducing circuit acquires a reproduced signal from a signal representing the detected light beam from the photodetector. In the A/D converter, the comparators which are arranged depending on magnitudes of the standard voltages compare a plurality of respective standard voltages with an analog input value for a magnitude thereof. The logic boundary detector detects a logic boundary point where output signals from the comparators change from one level to another level. The majority circuits are supplied with the output signals from the comparators and determines output signals based on a majority vote on the output signals from the comparators. The majority circuits have logic threshold values adjusted for respective input terminals thereof which are supplied with the output signals from the comparators. The majority circuits can thus have the logic threshold values designed optimally for respective input terminals thereof which are supplied with the output signals from the comparators. Even if the comparators suffer a bubble error and an error due to a metastable state, the output signals from the comparators are prevented from having a plurality of logic boundary points.

According to an embodiment of the present invention, there is further provided an information recording and reproducing apparatus including an optical pickup for applying a light beam to a track on an optical recording medium, the optical pickup having a photodetector for detecting a light beam reflected from the optical recording medium, and a wobble signal extracting circuit for acquiring a wobble signal from a signal representing the detected light beam from the photodetector. The wobble signal extracting circuit includes an A/D converter including a plurality of comparators for comparing a plurality of respective standard voltages with an analog input value for a magnitude thereof, the comparators being arranged depending on magnitudes of the standard voltages, a logic boundary detector for detecting a logic boundary point where output signals from the comparators change from one level to another level, and a plurality of majority circuits for being supplied with the output signals from the comparators and determining output signals based on a majority vote on the output signals from the comparators, the majority circuits having logic threshold values adjusted for respective input terminals thereof which are supplied with the output signals from the comparators.

The optical pickup applies a light beam to a track on an optical recording medium, and the photodetector detects a light beam reflected from the optical recording medium. The wobble signal extracting circuit acquires a wobble signal from a signal representing the detected light beam from the photodetector. In the A/D converter, the comparators which are arranged depending on magnitudes of the standard voltages compare a plurality of respective standard voltages with an analog input value for a magnitude thereof. The logic boundary detector detects a logic boundary point where output signals from the comparators change from one level to another level. The majority circuits are supplied with the output signals from the comparators and determines output signals based on a majority vote on the output signals from the comparators. The majority circuits have logic threshold values adjusted for respective input terminals thereof which are supplied with the output signals from the comparators. The majority circuits can thus have the logic threshold values designed optimally for respective input terminals thereof which are supplied with the output signals from the comparators. Even if the comparators suffer a bubble error and an error due to a metastable state, the output signals from the comparators are prevented from having a plurality of logic boundary points.

According to the present invention, the A/D converter and the information recording and reproducing apparatus are capable of reliably preventing a bubble error and an error due to a metastable state.

BRIEF DESCRIPTION OF THE DRAWINGS

FIG. 4 is a circuit diagram of the high-speed A/D converter shown in FIG. 1, with majority circuits AVG0 through AVG6 being added thereto;

DETAILED DESCRIPTION OF THE PREFERRED EMBODIMENT

Figure 1:
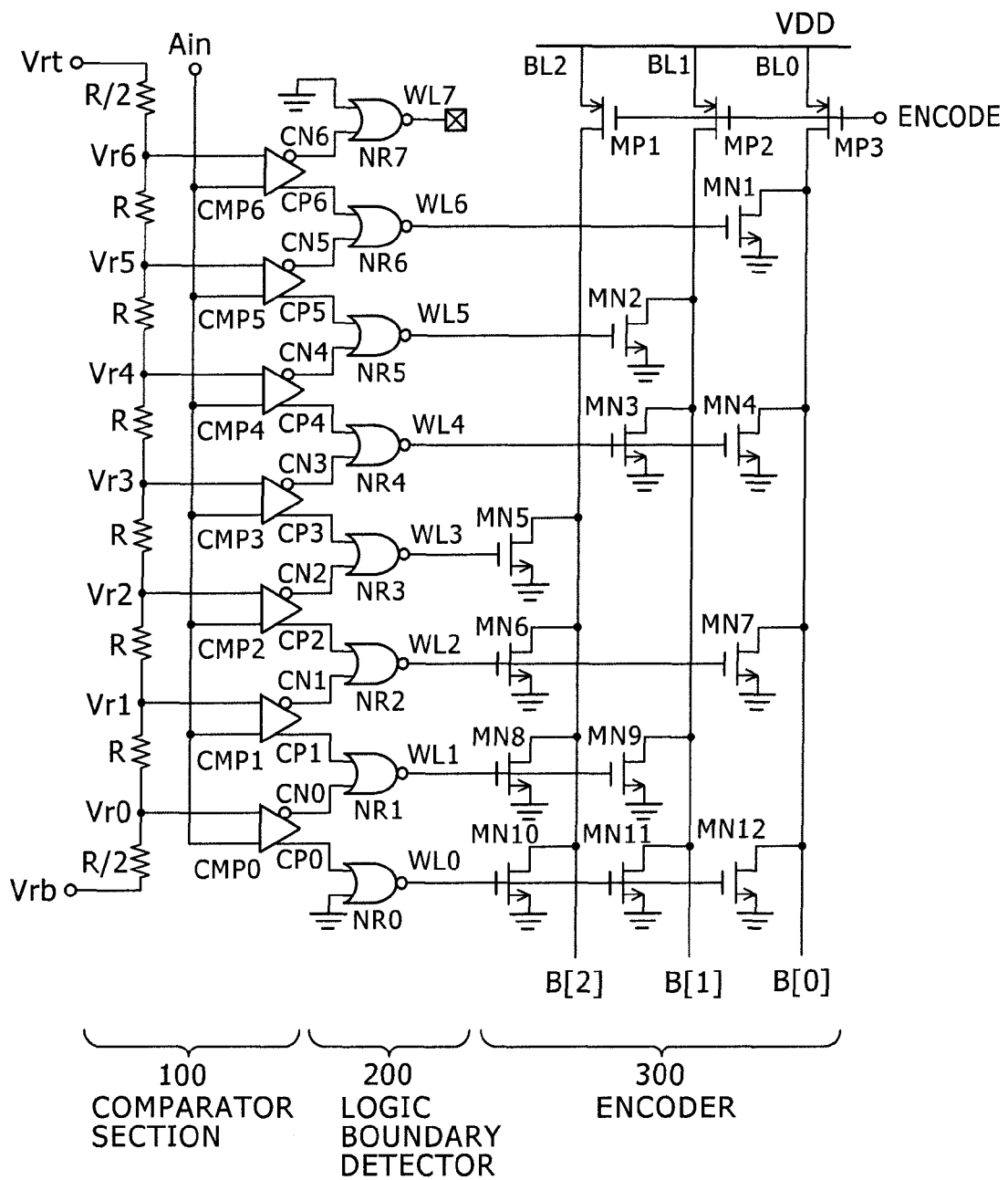
FIG. 1 is a circuit diagram of a flash A/D converter for outputting a 3-bit binary code as a high-speed A/D converter.

A preferred embodiment of the present invention will be described in detail below with reference to the accompanying drawings. Like or corresponding parts will be denoted by like or corresponding reference characters throughout views, and will not repeatedly be described below.

EXPLANATION OF RELATED ART

Prior to describing the embodiment of the present invention, a technology serving as the related art will first be described below. FIG. 1 is a circuit diagram of a flash A/D converter for outputting a 3-bit binary code as a high-speed A/D converter. As shown in FIG. 1, the flash A/D converter includes a comparator section 100, a logic boundary detector 200, and an encoder 300. The comparator section 100 includes seven comparators CMP0 through CMP6 for comparing an analog input signal Ain and standard voltages Vr0 through Vr6, respectively, and outputting a thermometer code depending on the magnitude of the analog input signal Ain. The logic boundary detector 200 detects logic boundary points between "0" and "1" of the output signals from comparators CMP0 through CMP6. The encoder 300 outputs a binary code B[2:0] based on output signals from the logic boundary detector 200.

Figure 2:
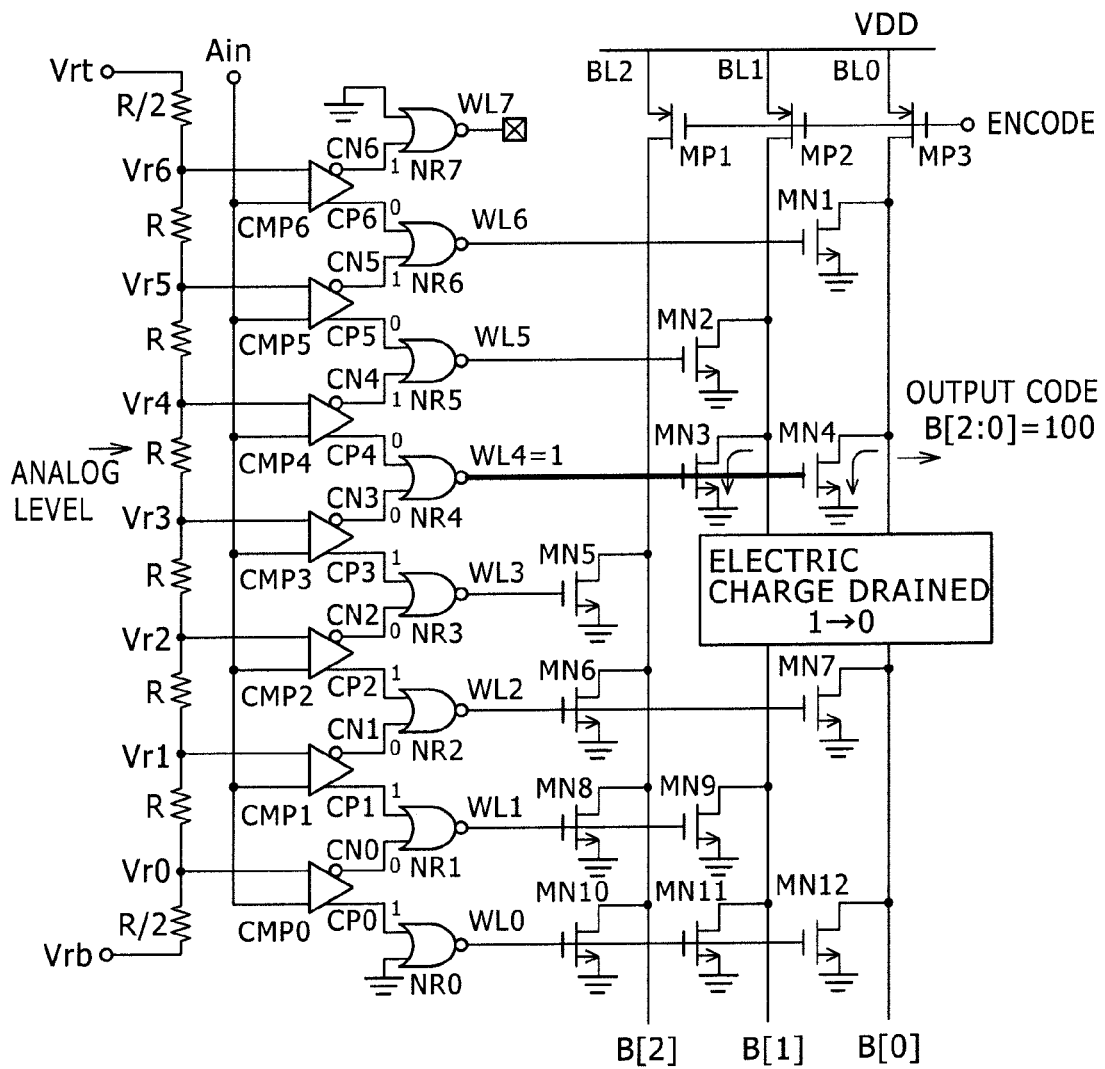
FIG. 2 is a circuit diagram of the high-speed A/D converter shown in FIG. 1, showing a state thereof wherein an analog input signal Ain is of a potential between Vr3 and Vr4.

The comparator section 100 includes a bank of eight resistors connected in series between a terminal for supplying a high-potential reference voltage Vrt and a terminal for supplying a low-potential reference voltage Vrb. The comparator section 100 produces the seven standard voltages Vr0 through Vr6 between the resistors. The two resistors at the respective opposite ends of the resistor bank have resistance values R/2 which are one-half of the resistance values R of the other resistors of the resistor bank. The seven comparators CMP0 through CMP6 compare the analog input signal Ain and the seven standard voltages Vr0 through Vr6, respectively. If the analog input signal Ain is higher than the standard voltages Vr0 through Vr6, then the comparators CMP0 through CMP6 produce respective output signals CP0 through CP6 of "1" and respective inverted output signals CN0 through CN6 of "0." Conversely, if the analog input signal Ain is lower than the standard voltages Vr0 through Vr6, then the comparators CMP0 through CMP6 produce respective inverted output signals CN0 through CN6 of "1" and respective output signals CP0 through CP6 of "0." For example, FIG. 2 shows a state wherein the analog input signal Ain is of a potential between the standard voltages Vr3 and Vr4. When the analog input signal Ain is higher than the standard voltage Vr3 and lower than the standard voltage Vr4, as shown in FIG. 2, then the comparator section 100 outputs a thermometer code represented by output signals CP0 through CP3 of "1" and output signals CP4 through CP6 of "0," and a thermometer code represented by inverted output signals CN0 through CN3 of "0" and inverted output signals CN4 through CN6 of "1."

As shown in FIG. 1, the logic boundary detector 200 is disposed in a stage subsequent to the comparator section 100. The thermometer code represented by the output signals CP0 through CP6 and the thermometer code represented by the output signals CN0 through CN6 from the comparator section 100 are input to eight 2-input NOR gates NR0 through NR7 of the logic boundary detector 200. Specifically, comparator output signals CNi−1, CPi are input to a NOR gate NRi (i represents an integer). The NOR gate NR0 has an input terminal supplied with the output signal CP0 and another input terminal supplied with "1." The NOR gate NR7 has an input terminal supplied with the output signal CN6 and another input terminal supplied with "0." The NOR gate NRi produces an output signal of "1" only when (CPi−1, CPi)=(1, 0). Therefore, the NOR gate that is located at a position where a succession of "1s" changes to a succession of "0s" in the successive output signals CP0 through CP6, CN0 through CN6 produces an output signal of "1." In FIG. 2, since (CP3, CP4)=(1, 0), the NOR gate NR4 produces an output signal of "1."

Encoder 300 can selectively be set to two states, i.e., a precharging mode and an encoding mode, by an encode signal as a control clock. The encoder 300 includes three PMOS transistors MP1 through MP3 and twelve NMOS transistors MN1 through MN12. The PMOS transistors MP1 through MP3 precharge respective bit lines BL0 through BL2 to VDD when the encoding signal is of an L level. Based on the output signals on output word lines WL0 through WL7 from the logic boundary detector 200, the NMOS transistors MN1 through MN12 pull down those of the bits on the bit lines BL0 through BL2 where output signals on the output word lines WL0 through WL7 are of "1," to GND, thereby producing a desired binary output signal B0 through B2.

When the encode signal is set to an L level to precharge the bit lines BL0 through BL2 to VDD and thereafter the analog input signal Ain of a potential that is higher than Vr3 and lower than Vr4 is applied to comparator section 100, then the logic boundary detector 200 sets only the output signal on the output word line WL4 to an H level, turning on the NMOS transistors MN3, MN4. When the encode signal is then set to an H level, the bit lines BL1, BL0 are pulled down to GND, producing an encoded binary signal B[2:0]=100.

Figure 3:
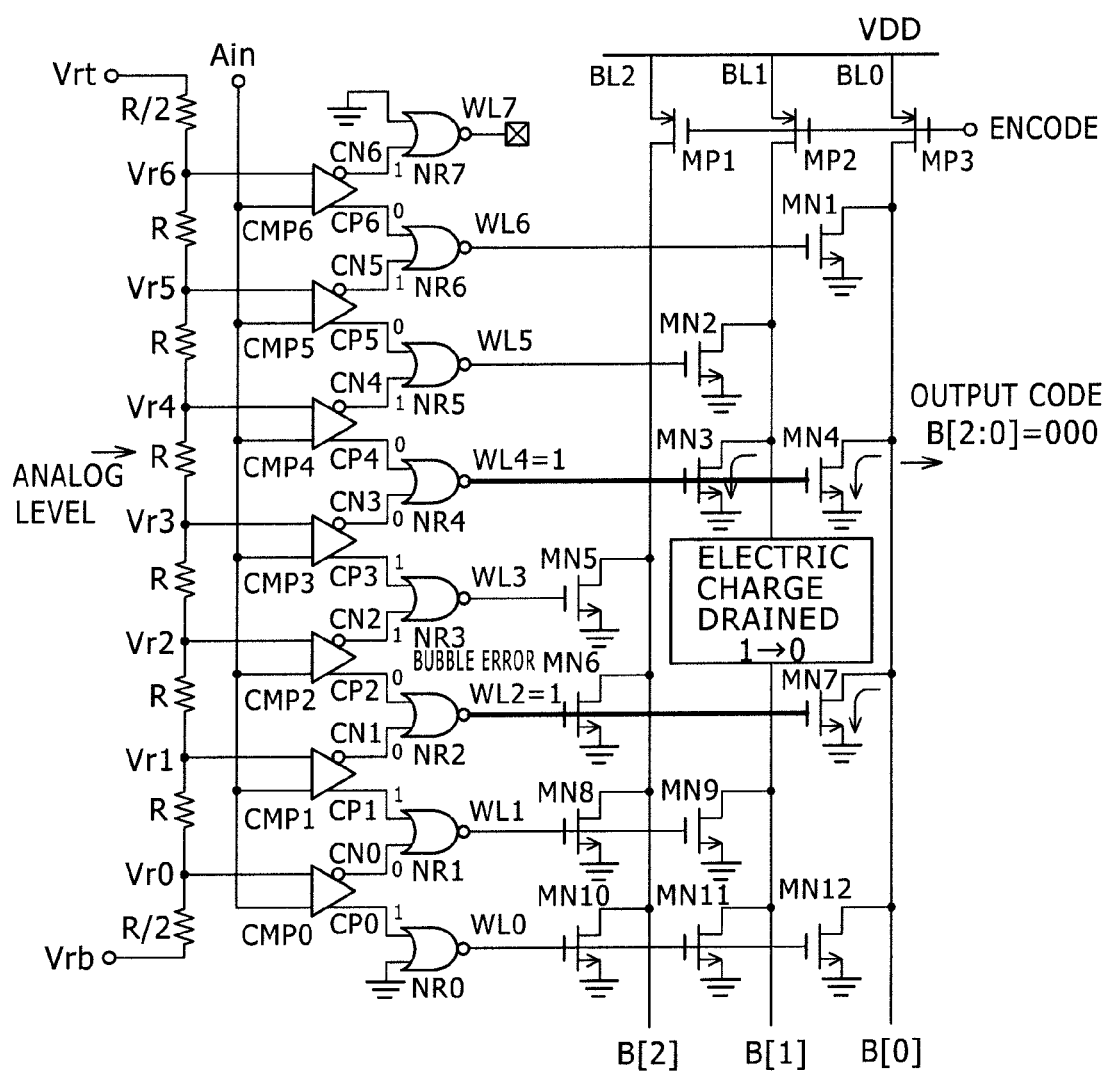
FIG. 3 is a circuit diagram of the high-speed A/D converter shown in FIG. 1, showing a state thereof wherein a bubble error has occurred.

The A/D converter which employs the above thermometer codes may cause an error referred to as a bubble error in the thermometer codes. For example, the comparator output signals CP0 through CP6 shown in FIG. 2 need to have a pattern "1111000" where there is a single point of changing between "1" and "0" in order to indicate the level of the analog input signal Ain. FIG. 3 shows the A/D converter in a state wherein a bubble error has occurred, causing the comparator CMP2 to produce an output signal CP2=0 and an inverted output signal CN2=1. Because of the bubble error, the comparator output signals CP0 through CP6 shown in FIG. 3 have a pattern "1101000" where there are at least two points of changing between "1" and "0." Accordingly, two word lines WL2, WL4 shown in FIG. 3 are simultaneously turned on, resulting in a large error in the output code.

When a plurality of word lines are simultaneously turned on, all the bit lines BL0 through BL2 are highly likely to be pulled down to GND, as shown in FIG. 3. If all the bit lines BL0 through BL2 are pulled down to GND, then the encoder 300 produces an encoded binary signal B[2:0]=000, which suffers a large error from the true binary signal B[2:0]=100.

Figure 5:
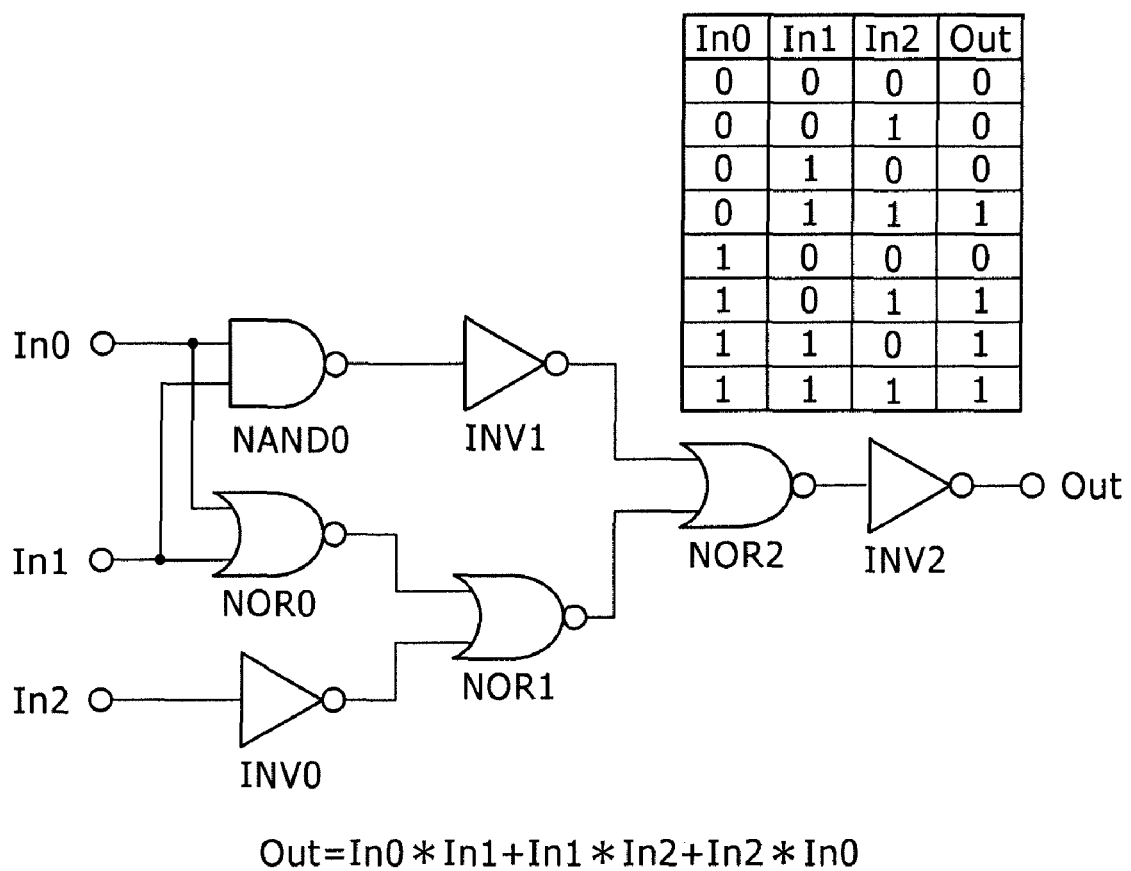
FIG. 5 is a block diagram of a majority circuit.

One solution to prevent such a bubble error from occurring is a digital averaging process for taking a majority vote on (averaging) a bit in question and adjacent bits. FIG. 4 shows the A/D converter shown in FIG. 1, with majority circuits AVG0 through AVG6 being added thereto. FIG. 5 shows a majority circuit in block form. The majority circuit shown in FIG. 5 is represented by a logical formula Out=In0*In1+ In1*In2+In2*In0, and has a truth table also shown in FIG. 5. As can be seen from the logical formula, when at least two out of the three inputs In0, In1, In2 are "1," the majority circuit an output signal Out=1, and when at least two out of the three inputs In0, In1, In2 are "0," the majority circuit an output signal Out=0. The majority circuit derives its name from the above operation.

As shown in FIG. 4, the majority circuits AVG0 through AVG6 are connected between the comparators CMP0 through CMP6 and the NOR gates NR0 through NO7 of the logic boundary detector 100. Each majority circuit AVGi (i represents an integer) includes a 3-input, 1-output circuit, takes a majority vote on three inputs CPi−1, CPi, CPi+1, and outputs the result of the majority vote. FIG. 4 shows the manner in which the bubble error shown in FIG. 3 is prevented from occurring by the majority circuits AVGi.

As shown in FIG. 4, a bubble error "0" of the output signal CP2 from the comparator CMP2 is corrected into "1" because the majority circuit AVG2 takes a majority vote on CP2, CP1, CP3, and the corrected output signal CP2 is input to the encoder 300. As a result, the encoder 300 produces the same binary signal as the binary signal free from a bubble error as shown in FIG. 1. It can also be seen from FIG. 4 that the output signals from the majority circuits have only one logic boundary. Therefore, the majority circuits are effective to prevent a bubble error from occurring. The majority circuit AVGi is of a simple structure including three inverters INV0 through INV2, three 2-input NOR gates NOR0 through NOR2, and one 2-input NAND gate NAND0. Nevertheless, majority circuit AVGi is particularly effective for use in the A/D converter of the type described above because it is highly effective to prevent a bubble error from occurring.

Although a bubble error in the A/D converter can be prevented by the majority circuits, as described above, the A/D converter also suffers an error caused by a metastable state. The metastable state refers to a state wherein when the analog input signal Ain and either one of the standard voltages Vr0 through Vr6 are substantially equal to each other, the comparators CP0 through CP6 are unable to determine the relationship between the magnitudes of their numerical values, and output an indefinite intermediate potential. Particularly, since the high-speed A/D converter has a limited time for comparison, the comparators CP0 through CP6 outputs "0" or "1" or an "intermediate potential" which is neither "0" nor "1." For illustrative purposes, an output code (intermediate potential) of a CMP in a metastable state is represented by "m" which is the initial character of "metastable."

For example, it is assumed that when the analog input signal Ain≈Vr3 is input to the A/D converter shown in FIG. 1, the comparator CMP3 produces an output signal "m" representative of a metastable state. At his time, the comparators CMP0 through CMP2 produce respective output signals CP0 through CP2=1 and the other comparators CMP4 through CMP6 produce respective output signals CP4 through CP6=0. Therefore, the comparators CMP0 through CMP6 produce respective output signals CP0 through CP6 having a pattern "111m000." If an error is caused by the metastable, then irrespective of whether the true value of "m" is "1" or "0," since only one logic boundary point between "0" and "1" is detected from the output signals from the logic boundary detector 200, no large error is caused in the binary output signal when two or more word lines are simultaneously turned on.

Figure 6:
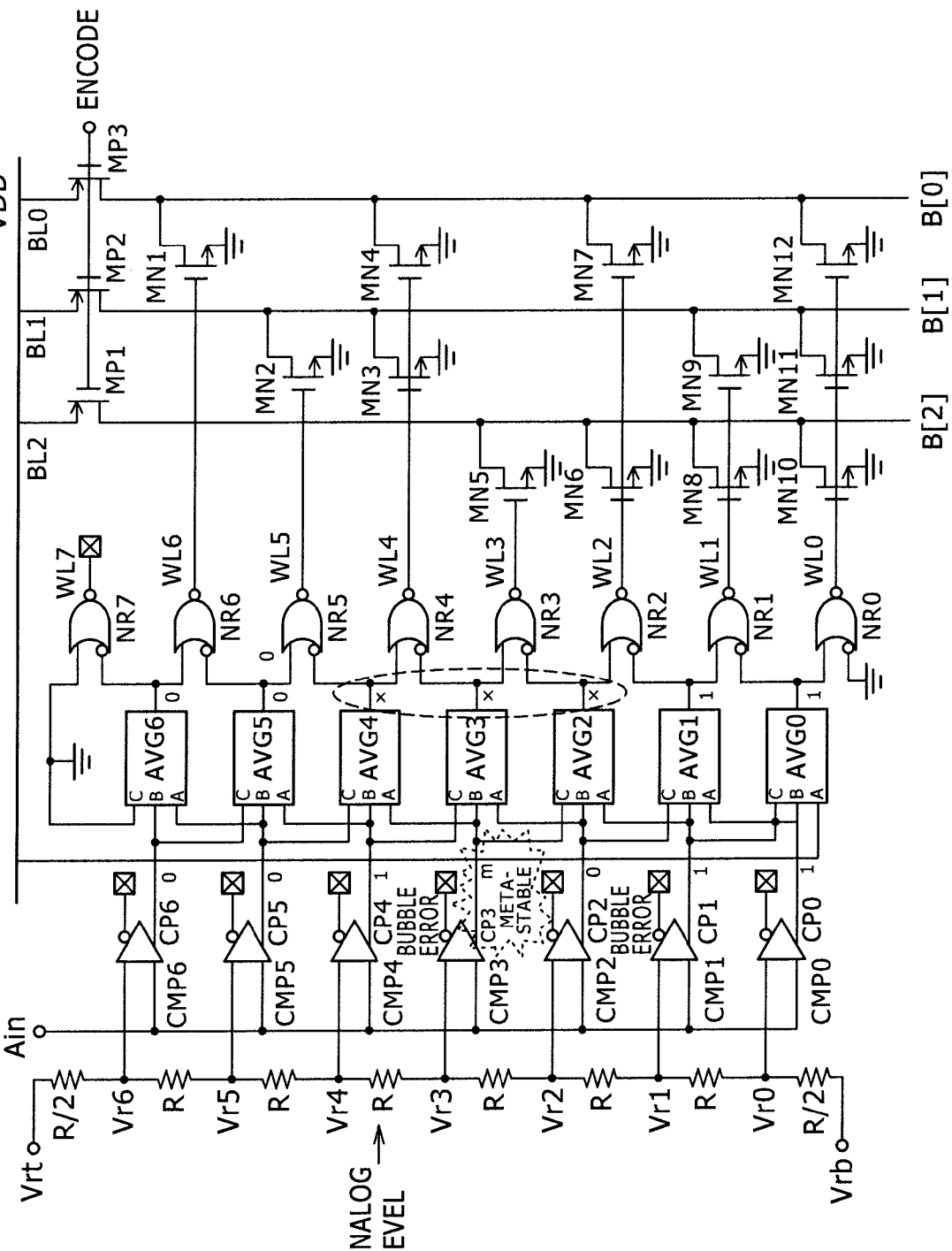
FIG. 6 is a circuit diagram of the high-speed A/D converter shown in FIG. 4, showing a state thereof wherein an error due to a metastable state has occurred.

However, if the A/D converter suffers an error due to a metastable state and a bubble error at the same time, then the binary output signal may possibly contain a large error. FIG. 6 shows the A/D converter in a state wherein the output signal CP4 suffers a bubble error when the comparator CMP3 produces an output signal "m" as described above, with the result that the comparators CMP0 through CMP6 produce respective output signals CP0 through CP6 having a pattern "110m000." As shown in FIG. 6, the output signals "0," "1," "m" are input to each of the majority circuits AVG2 through AVG4, the output signals from the majority circuits AVG2 through AVG4 depend on the value "m." As a result, the majority circuits AVG0 through AVG6 generally produce output signals having a pattern "11mmm00." Specifically, the input signals of the majority circuits AVG0 through AVG6, i.e., the output signals of the comparators CMP0 through CMP6, assume a metastable state "m" including an intermediate potential. However, since the digital logic circuits that make up the majority circuits AVG0 through AVG6 have a very high gain in the vicinity of logic threshold values thereof, the majority circuits AVG0 through AVG6 do not output an intermediate potential. Therefore, the output signals of the majority circuits AVG0 through AVG6 necessarily have a value of either "1" or "0" (indefinite value) depending on the metastable state "m." It will hereinafter be assumed that a metastable state including an intermediate potential in the output signals of the comparators CMP0 through CMP6 is represented by "m" and an indefinite value, not including an intermediate potential, of the output signals of the majority circuits AVG0 through AVG6 by "x." The output signals having the pattern "11mmm00" of the majority circuits AVG0 through AVG6 are thus defined as "11xxx00" not including an intermediate potential, where x is either "0" or "1." If xxx=101, then the output signals of the majority circuits AVG0 through AVG6 have a pattern "1110100," thereby turning on a plurality of word lines (WL3 and WL4 in FIG. 6). Therefore, the digital averaging process using the majority circuits is not perfect in preventing an error including a metastable state, and may cause, in worst cases, a comparator output signal pattern "110m100" to turn into a majority circuit output signal pattern "11xxx00" as shown in FIG. 6. Inasmuch as a bubble error and a metastable state can simultaneously occur necessarily with a certain probability, it is important to provide some countermeasures for preventing those errors. The term "bubble error" is occasionally used in a wider sense to refer to errors which make it difficult to detect a logic boundary, and covers errors due to metastable states. In the present specification, however, the term "bubble error" will be used in a narrower sense as described above, and an error caused by an intermediate potential of the comparator output signals will be referred to as an error due to a metastable state.

Outline of the Embodiment of the Present Invention

The preferred embodiment of the present invention will be described in detail below. First, a process of preventing a bubble error and an error due to a metastable state which occur simultaneously will be described below. Even when the majority circuits AVG0 through AVG6 produce an output signal pattern "11xxx00" as shown in FIG. 6, if the value of "xxx" is 000, 100, 110, or 111, then the majority circuit output signal pattern is "1100000," "1110000," "1111000," or "1111100." Since these majority circuit output signal patterns contain only one logic boundary, they will not activate a plurality of word lines at the same time. If the value of "xxx" is 001, 010, 011, or 101, however, the majority circuit output signal patterns will activate a plurality of word lines at the same time, so that the encoder will produce an encoded binary signal which contains an error from the true binary signal. Consequently, insofar as the majority circuits AVG0 through AVG6 produce an output signal pattern "11xxx00," the encoded binary signal is like to suffer an error with a very high probability of 50. The present embodiment is designed to avoid such an error.

The value of "xxx" is 000, 100, 110, or 111, which will not cause an encoded binary signal error, in the majority circuit output signal pattern "11xxx00" will be analyzed below. The value of "xxx" is 000, 100, 110, or 111 indicates that the output signal of the majority circuit AVGi (i is an integer) contains more "1s" as the value of i is smaller and more "0s" as the value of i is greater. Specifically, the output signal of the majority circuit AVG2 contains three "1s," the output signal of the majority circuit AVG3 contains two "1s," and the output signal of the majority circuit AVG4 contains one "1." Therefore, the probability that "1" will appear in the output signal of the majority circuit AVGi is progressively smaller in the order of (AVG2 output)>(AVG3 output)>(AVG4 output). Furthermore, as shown in FIG. 6, the majority circuit AVG2 has a terminal C supplied with the metastable "m" from the comparator CMP3. Similarly, the majority circuit AVG3 has a terminal B supplied with the metastable "m" from the comparator CMP3, and the majority circuit AVG4 has a terminal A supplied with the metastable "m" from the comparator CMP3. In other words, the three majority circuits AVG2 through AVG4 have different terminals supplied with the metastable "m."

The present embodiment is based on the above features about the value of "xxx" is 000, 100, 110, or 111 and the terminals of the majority circuits AVG2 through AVG4 that are supplied with the metastable "m." According to the present embodiment, digital averaging circuits which tend to output "1" when the metastable "m" is supplied to the terminal C and output "0" when the metastable "m" is supplied to the terminal A are used as majority circuits. The digital averaging circuits according to the present embodiment output either "0" or "1" when the metastable "m" is supplied to the terminal B.

Figure 7A:
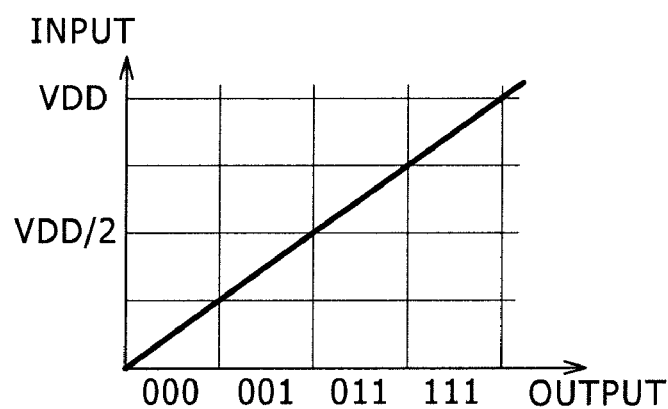
FIGS. 7A through 7D are diagrams showing output signals from majority circuits AVGi−1, AVGi, AVGi+1 when a comparator CMPi outputs a metastable "m"

FIGS. 7A through 7D are diagrams showing output signals from majority circuits AVGi−1, AVGi, AVGi+1 when a comparator CMPi outputs a metastable "m." FIG. 7A shows the values of output signals that are produced from the majority circuits AVGi−1, AVGi, AVGi+1 as an intermediate potential "m" input thereto changes from 0 to VDD. As shown in FIG. 7A, as the intermediate potential "m" increases, a three-figure binary code output from the majority circuits AVGi−1, AVGi, AVGi+1 changes as follows: (AVGi−1, AVGi, AVGi+1)=(0, 0,0)→(0,0,1)→(0,1,1)→(1,1,1). Therefore, the majority circuits AVGi−1, AVGi, AVGi+1 produce output signals whose pattern includes "xxx"=000, 100, 110, or 111 which prevents the encoded binary signal from suffering an error.

Figure 7B:
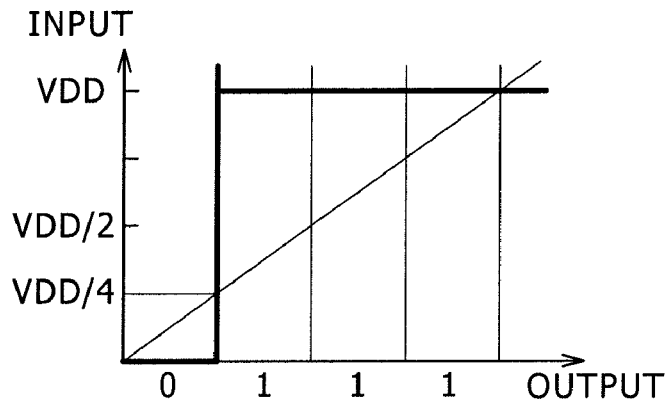
Figure 7C:
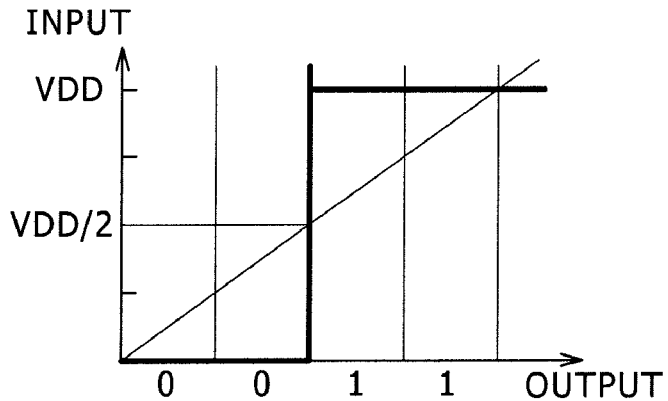
Figure 7D:
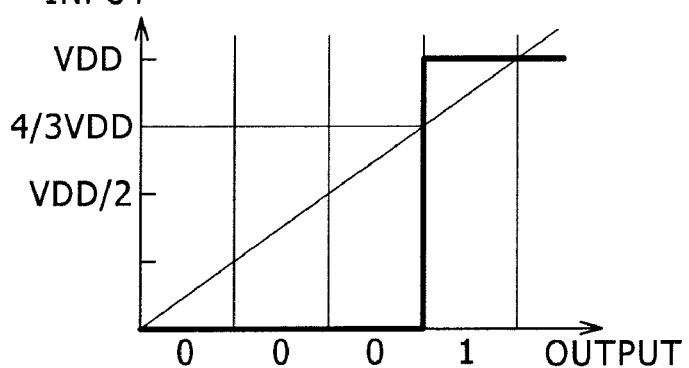

FIGS. 7B, 7C, and 7D show the threshold values of the majority circuits AVGi−1, AVGi, AVGi+1 that are adjusted to produce the output signals shown in FIG. 7A. Specifically, FIG. 7B shows the manner in which the output signal from the majority circuit AVGi−1 changes depending on the value of the intermediate potential "m" that is input to the terminal C thereof. As shown in FIG. 7B, when the value of the intermediate potential "m" is lower than VDD/4, the majority circuit AVGi−1 produces an output signal of "0," and when the value of the intermediate potential "m" is higher than VDD/4, the majority circuit AVGi−1 produces an output signal of "1." Therefore, the majority circuit AVGi−1 is likely to produce an output signal of "1" when the intermediate potential "m" that is input to the terminal C.

FIG. 7D shows the manner in which the output signal from the majority circuit AVGi+1 changes depending on the value of the intermediate potential "m" that is input to the terminal A thereof. As shown in FIG. 7D, when the value of the intermediate potential "m" is lower than ¾×VDD, the majority circuit AVGi+1 produces an output signal of "0," and when the value of the intermediate potential "m" is higher than ¾×VDD, the majority circuit AVGi+1 produces an output signal of "1." Therefore, the majority circuit AVGi−1 is likely to produce an output signal of "0" when the intermediate potential "m" that is input to the terminal A.

FIG. 7C shows the manner in which the output signal from the majority circuit AVG changes depending on the value of the intermediate potential "m" that is input to the terminal B thereof. As shown in FIG. 7C, when the value of the intermediate potential "m" is lower than VDD/2, the majority circuit AVGi produces an output signal of "0," and when the value of the intermediate potential "m" is higher than VDD/2, the majority circuit AVGi+1 produces an output signal of "1." Therefore, the majority circuit AVGi produces an output signal depending on the intermediate potential "m" based on the normal threshold value VDD/2 when the intermediate potential "m" that is input to the terminal B.

Consequently, when a comparator CMPi outputs a metastable "m," the majority circuit AVGi−1 is likely to produce an output signal of "1," and the majority circuit AVGi+1 is likely to produce an output signal of "0." Therefore, the majority circuits AVGi−1, AVGi, AVGi+1 produce output signals whose pattern includes "xxx"=000, 100, 110, or 111 which prevents the A/D converter from producing an encoded binary signal error due to the metastable state.

Specific structural details for adjusting the threshold value will be described below.

Specific Configuration of the Adjusting Threshold Values

Figure 8A:
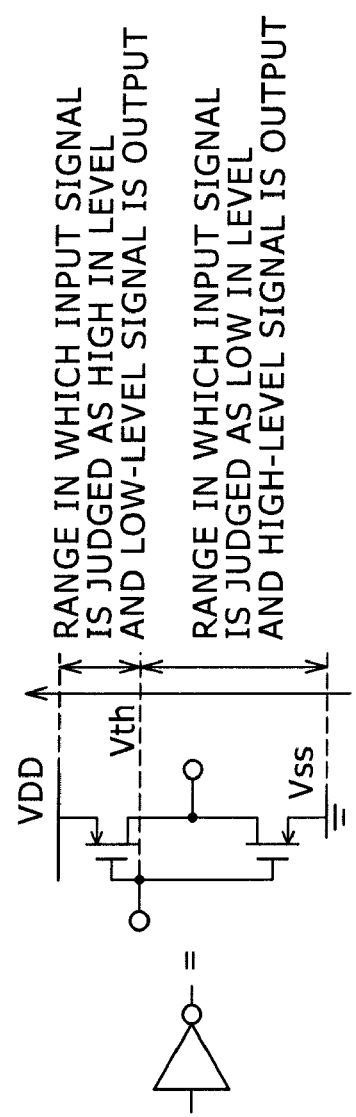
FIGS. 8A and 8B are circuit diagrams illustrative of the principle for increasing a logic threshold value in an inverting circuit including a CMOS inverter.
Figure 8B:
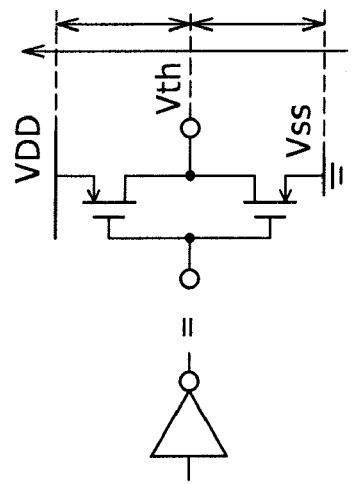

As shown in FIG. 5, each of the majority circuits includes a combination of logic gates. For example, a greater tendency of an inverting circuit INV to produce an output signal of "1" is equivalent to a higher logic threshold value used by the inverting circuit INV. FIGS. 8A and 8B are illustrative of the principle for increasing a logic threshold value in an inverting circuit including a CMOS inverter. FIG. 8A shows a logic threshold value Vth which is equal to normal VDD/2, and FIG. 8B shows a logic threshold value Vth which is higher than VDD/2.

As shown in FIG. 8B, when the logic threshold value Vth is higher than VDD/2, the inverting circuit has a greater range in which it judges its input signal as being low. Accordingly, when the logic threshold value Vth is increased, the inverting circuit is likely to produce an output signal of "1" (high). The logic threshold value Vth is defined as a state wherein current values of a PMOS transistor and a NMOS transistor are equal to each other. For increasing the logic threshold value Vth, a voltage drop due to a current flowing through the NMOS transistor may be increased, and a voltage drop due to a current flowing through the PMOS transistor may be reduced. The voltage drop may be adjusted by relatively adjusting the resistance values, i.e., ratios W/L, of the PMOS and NMOS transistors where W represents the channel width and L the channel length.

Specifically, the current value $I_p$ of the PMOS transistor is expressed using motilities $\mu_p$, $\mu_n$, an oxide film capacitance $C_{ox}$, a channel length $L_p$, a power supply voltage VDD, a transistor threshold value $V_{th,p}$, and an input voltage $V_{in}$, as follows:

$$I_p = \frac{1}{2}\mu_p C_{OX} \frac{W_p}{L_p}(VDD - V_{in} + V_{th,p})^2$$

Similarly, the current value $I_n$ of the NMOS transistor is expressed as follows:

$$I_n = \frac{1}{2}\mu_n C_{OX} \frac{W_n}{L_n}(V_{in} - V_{th,p})^2$$

The channel length L and the channel width W can be changed relatively easily. For $I_p=I_n$ when the input voltage $V_{in}$ is high, the square term $(VDD-V_{in}+V_{th,p})^2$ is reduced and the square term $(V_{in}-V_{th,p})^2$ is increased. Therefore, $W_p/L_p$ may be made greater than $W_n/L_n$. Generally, typical values for achieving $I_p=I_n$ when $V_{in}=VDD/2$ are $W_n/L_n$: $W_p/L_p=1:2$. If $W_n/L_n$: $W_p/L_p=1:4$, then the logic threshold value Vth becomes higher, and if $W_n/L_n$:$W_p/L_p=1:1$, then the logic threshold value Vth becomes lower.

According to the present embodiment, majority circuits which are likely to produce an output signal of "1" and an output signal of "0" are constructed based on the above principles. Although a process of adjusting the logic threshold value by changing the ratio W/L of a transistor will be described below, the logic threshold value may be adjusted by other processes. For example, the logic threshold value of a majority circuit may be adjusted by constructing the majority circuit of transistors having different response speeds. Specifically, since a transistor having a higher response speed has a lower resistance value, a voltage drop due to a current flowing through the transistor is smaller. Accordingly, the threshold voltage can be adjusted by using such a transistor as well as by changing the ratio W/L.

Figure 9:
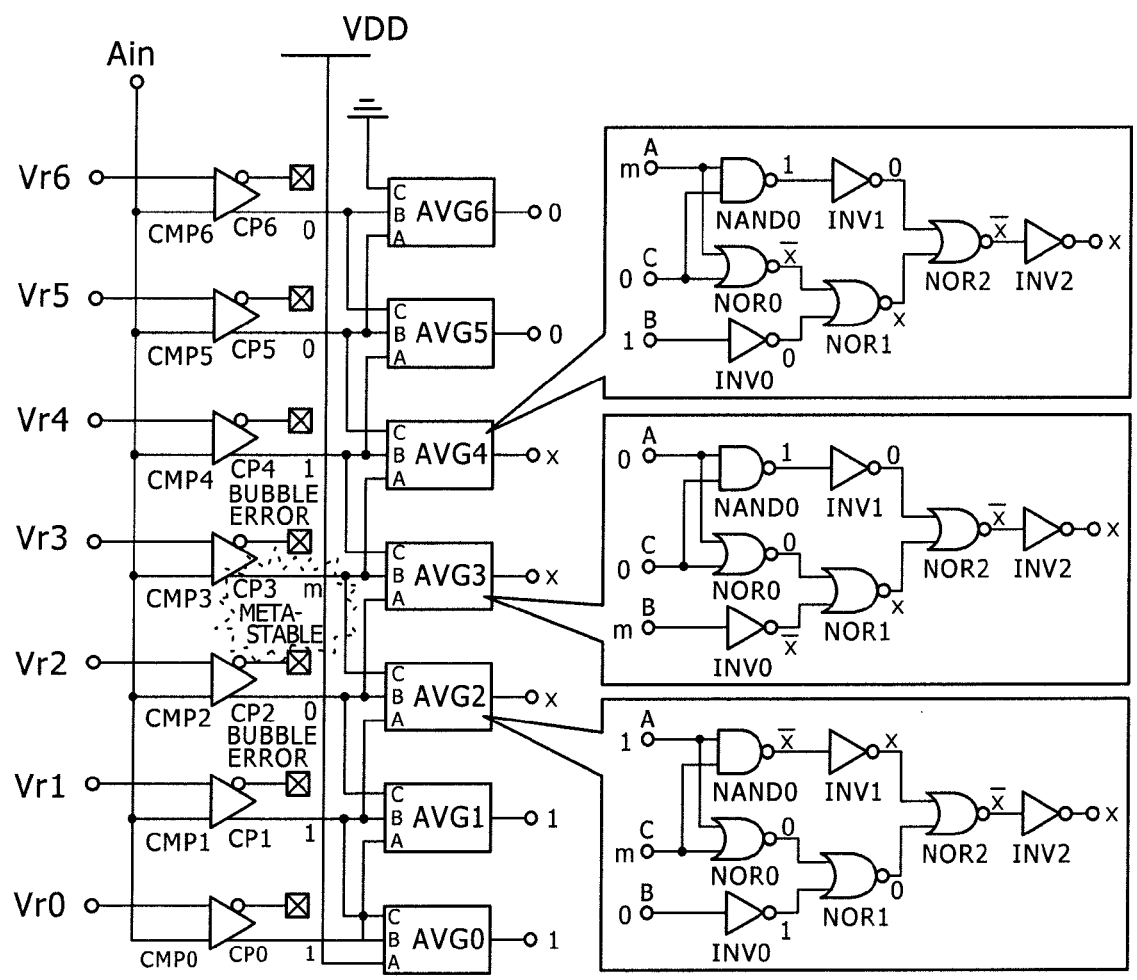
FIG. 9 is a circuit diagram of the high-speed A/D converter shown in FIG. 6, showing the manner in which the metastable state "m" input to majority circuits AVG2 through AVG4 propagates an indefinite value "x" at a gate level.

FIG. 9 shows the manner in which the metastable state "m" input from the comparator CMP3 to the majority circuits AVG2 through AVG4 of the A/D converter shown in FIG. 6 propagates an indefinite value "x" at a gate level.

As shown in FIG. 9, in the majority circuit AVG2, since the signal of "1" is input from the terminal A to an input terminal of the NOR gate NOR0, the NOR gate NOR0 produces an output signal of "0" irrespectively of the value of the metastable state "m" that is input to the other input terminal of the NOR gate NOR0. The inverter INV0 produces an output signal of "1" because the signal of "0" is input from the terminal B to the input terminal of the inverter INV0. Therefore, the signals of "0," "1" are applied respectively to the two input terminals of the NOR gate NOR1, which produces an output signal of "0." Therefore, the metastable state "m" is not propagated as the output signals of the NOR gate NOR0, the inverter INV0, and the NOR gate NOR1.

When the signal of "1" is input from the terminal A to an input terminal of the NAND gate NAND0 and the metastable state "m" is input to the other input terminal of the NAND gate NAND0, the NAND gate NAND0 produces an output signal of "0" or "1" depending on the value of the metastable state "m." The inverter INV1 inverts the output signal from the NAND gate NAND0, and inputs the inverted signal to an input terminal of the NOR gate NOR2. Since the signal of "0" is input to the other input terminal of the NOR gate NOR2, the NOR gate NOR2 inverts the output signal from the inverter INV1 and outputs the inverted signal. The inverter INV2 inverts the output signal from the NOR gate NOR2 and outputs the inverted signal. Therefore, the majority circuit AVG2 outputs an indefinite value "x" depending on the metastable state "m," and the indefinite value "x" is propagated from the NAND gate NAND0 to the inverter IVN1 to the NOR gate NOR2 to the inverter INV2 while being repeatedly inverted.

Similarly, the majority circuit AVG3 outputs an indefinite value "x" depending on the metastable state "m," and the indefinite value "x" is propagated from the inverter INV0 to the NOR gate NOR1 to the NOR gate NOR2 to the inverter INV2 while being repeatedly inverted. The majority circuit AVG4 outputs an indefinite value "x" depending on the metastable state "m," and the indefinite value "x" is propagated from the NOR gate NOR0 to the NOR gate NOR1 to the NOR gate NOR2 to the inverter INV2 while being repeatedly inverted.

In order for the majority circuit AVG2 to be likely to produce an output signal of "1" as "x" when the metastable state "m" is input to the terminal C, the logic threshold value of the NAND gate NAND0 in the propagation path of "x" may be adjusted to make the NAND gate NAND0 likely to produce an output signal of "0." When the NAND gate NAND0 produces an output signal of "0," since it is repeatedly inverted while being propagated from the inverter IVN1 to the NOR gate NOR2 to the inverter INV2, the majority circuit AVG2 produces an output signal of "1," as shown in FIG. 9.

Likewise, in order for the majority circuit AVG4 to be likely to produce an output signal of "0" as "x" when the metastable state "m" is input to the terminal A, the logic threshold value of the NOR gate NOR0 in the propagation path of "x" may be adjusted to make the NOR gate NOR0 likely to produce an output signal of "1." When the NOR gate NOR0 produces an output signal of "1," since it is repeatedly inverted while being propagated from the NOR gate NOR0 to the NOR gate NOR1 to the NOR gate NOR2 to the inverter INV2, the majority circuit AVG4 produces an output signal of "0," as shown in FIG. 9.

Figure 10:
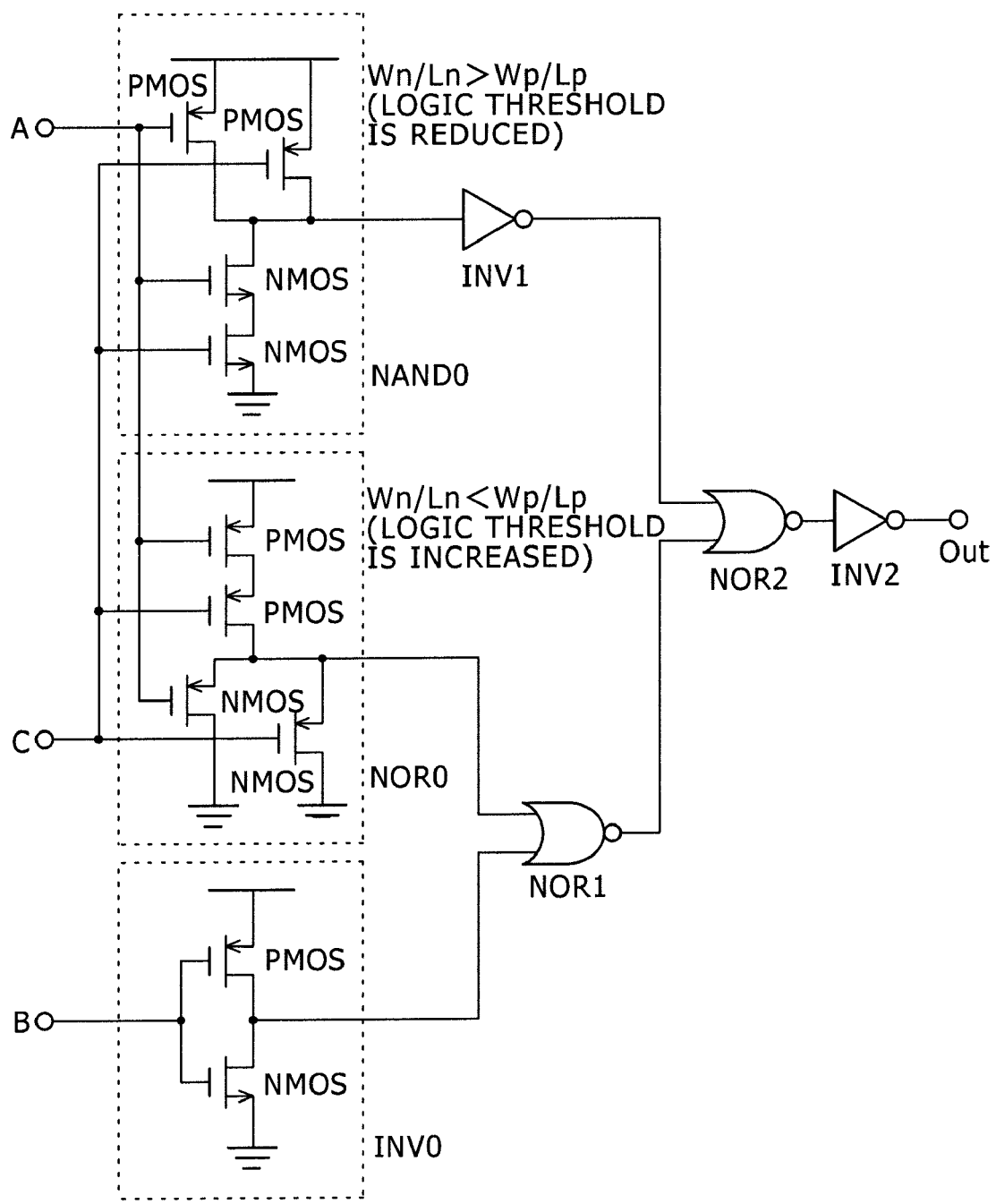
FIG. 10 is a circuit diagram showing in detail a majority circuit according to an embodiment of the present invention.

FIG. 10 is a circuit diagram showing in detail a majority circuit according to the embodiment of the present invention. The majority circuit shown in FIG. 10 as it is illustrated in block level is identical to the majority circuit shown in FIG. 5. In FIG. 10, the NAND gate NAND0, the NOR gate NOR0, and the inverter INV0 are illustrated in MOS transistor gate level. In the majority circuit according to the present embodiment, the inverter INV0, the inverter INV1, the inverter INV2, the NOR gate NOR1, and the NOR gate NOR2 may have a logic threshold value in the vicinity of normal VDD/2.

The NAND gate NAND0 has a lower logic threshold value so as to be likely to produce an output signal of "0" when the metastable state "m" is input to the terminal C. To reduce the logic threshold value, the ratios W/L of the two series-connected NMOS transistors of the NAND gate NAND0 are increased. A 2-input NAND gate has $W_n/L_n$: $W_p/L_p=1:1$ for the typical threshold value VDD/2. If the 2-input NAND gate has $W_n/L_n$: $W_p/L_p=1:2$, then the logic threshold value becomes higher, and if the 2-input NAND gate has $W_n/L_n$: $W_p/L_p=2:1$, then the logic threshold value becomes lower. Therefore, if the ratios W/L of the NMOS transistors are increased, the NAND gate NAND0 is more likely to produce an output signal of "0" than if the logic threshold value is VDD/2.

The NOR gate NOR0 has a higher logic threshold value so as to be likely to produce an output signal of "1" when the metastable state "m" is input to the terminal A. To increase the logic threshold value, the ratios W/L of the two series-connected PMOS transistors of the NOR gate NOR0 are increased. A 2-input NOR gate has $W_n/L_n$: $W_p/L_p=1:4$ for the typical threshold value VDD/2. If the ratios W/L of the PMOS transistors are increased, the NOR gate NOR0 is more likely to produce an output signal of "1" than if the logic threshold value is VDD/2.

By thus adjusting the logic threshold values of the NAND gate NAND0 and the NOR gate NOR0 of the majority circuits AVGi, the majority circuits AVG1 are more likely to produce an output signal of "1" as i is greater in ascending order.

Figure 11:
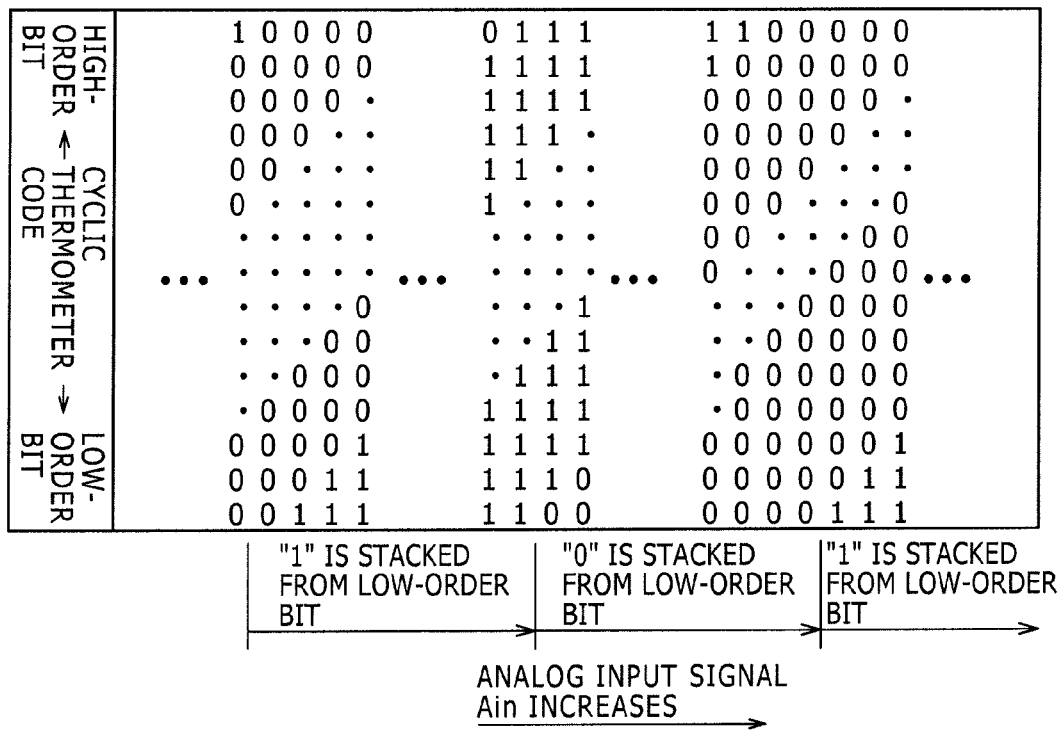
FIG. 11 is a diagram showing output signals from a cyclic thermometer code.

An ordinary thermometer code has been described above wherein the output signals CPi of the comparators CMPi shown in FIGS. 4 and 6 successively change from "0" to "1" in ascending order of i as the analog input signal Ain increases. There is another thermometer code referred to as "cyclic thermometer code" wherein, as shown in FIG. 11, as the analog input signal Ain increases, the output signals CPi of the comparators CMPi successively change from "0" to "1" ("1" is stacked from a low-order bit) in ascending order of i, and when all the output signals CPi change to "1," the output signals CPi successively change from "1" to "0" in ascending order of i. In FIG. 10, the output signals from the majority circuits are illustrated in each of the columns.

The cyclic thermometer code has a mode wherein "1" is stacked from a low-order bit and a mode wherein "0" is stacked from a low-order bit. In the mode wherein "1" is stacked from a low-order bit, an error can be corrected by the process described above. In the mode wherein "0" is stacked from a low-order bit, however, an error cannot be corrected by the process described above.

Circuit arrangements shown in FIGS. 12 through 15 are capable of correcting a bubble error and an error due to a metastable state which occur simultaneously with respect to the cyclic thermometer code. In FIG. 11, when the low-order bit is "1," the cyclic thermometer code is necessarily in the mode wherein "1" is stacked from the low-order bit, and when the low-order bit is "0," the cyclic thermometer code is necessarily in the mode wherein "0" is stacked from the low-order bit.

Similarly, when the high-order bit is "0," the cyclic thermometer code is necessarily in the mode wherein "1" is stacked from the low-order bit, and when the high-order bit is "1," the cyclic thermometer code is necessarily in the mode wherein "0" is stacked from the low-order bit.

Figure 12:
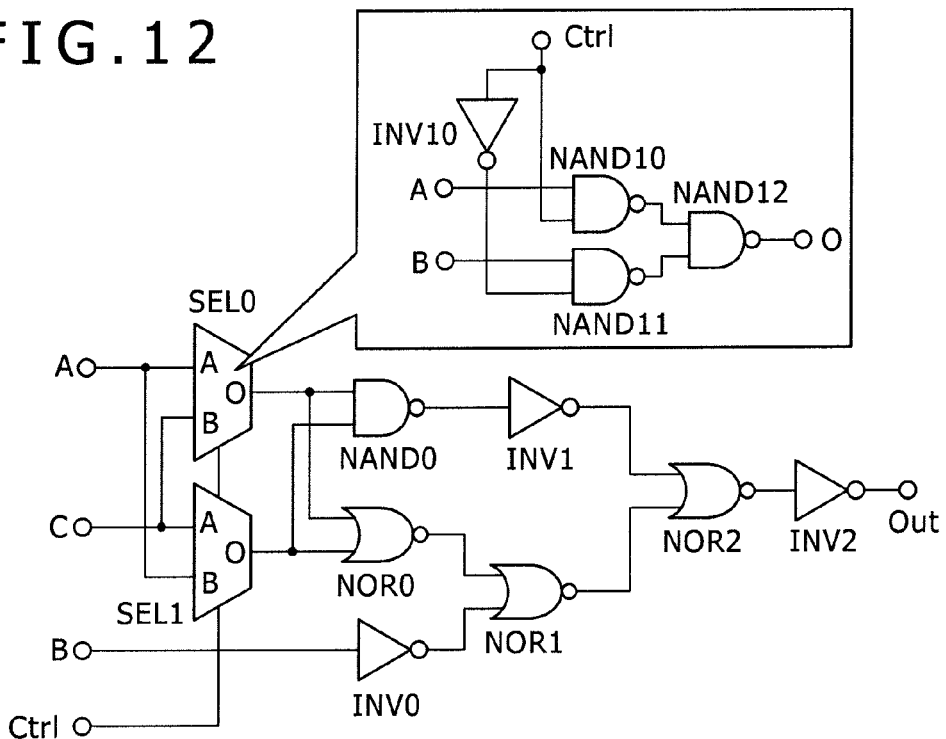
FIG. 12 is a block diagram of a detailed configuration of a majority circuit according to an embodiment of the present invention.

In the circuit arrangements shown in FIGS. 12 through 15, the connections of the input terminals A, B, C of each majority circuit are changed based on the low-order bit or the high-order bit. FIG. 12 shows in block form a majority circuit compatible with the cyclic thermometer code. The majority circuit shown in FIG. 12 differs from the majority circuit shown in FIG. 5 in that selectors SEL0, SEL1 are connected to the front stage of the majority circuit and are supplied with a control signal Ctrl depending on the low-order bit or the high-order bit.

As shown in FIG. 12, each of the selectors SEL0, SEL1 includes an inverter INV10 and three NAND gates NAND10, NAND11, NAND12. Each of the selectors SEL0, SEL1 is represented by a logical formula 0=A*Ctrl+B*Ctrl. When the control signal Ctrl is Ctrl=1, the selector outputs an input signal that is applied to the terminal A thereof (in FIG. 12, the output signal of "0" of the selector is equal to the input signal that is applied to the terminal A thereof). When the control signal Ctrl is Ctrl=0, the selector outputs an input signal that is applied to the terminal B thereof (in FIG. 12, the output signal of "0" of the selector is equal to the input signal that is applied to the terminal B thereof). It is assumed that the low-order bit is given as the control signal Ctrl.

When "1" is stacked from the low-order bit in the cyclic temperature code (Ctrl=1), the majority circuit shown in FIG. 12 has its input terminals A, B, C connected to the NAND gate NAND0 and the NOR gate NOR0 in the same manner as with the majority circuit shown in FIG. 5. When "0" is stacked from the low-order bit in the cyclic temperature code (Ctrl=0), the majority circuit shown in FIG. 12 changes the connections of its input terminals A, C to the NAND gate NAND0 and the NOR gate NOR0. With the changed connections, the majority circuit is now capable of preventing an error from occurring when the metastable state "m" is input from the preceding comparator, with respect to the cyclic thermometer code which has the mode wherein "1" is stacked from the low-order bit and the mode wherein "0" is stacked from the low-order bit.

With the majority circuit shown in FIG. 5, the logic threshold values of the NAND gate NAND0 and the NOR gate NOR0 are adjusted to provide a circuit that is likely to produce an output signal of "1" and a circuit that is likely to produce an output signal of "0" depending on the terminal to which the metastable state "m" is applied. With the majority circuit shown in FIG. 12, the logic threshold values of circuits of the selectors SEL0, SEL1 are adjusted to provide a circuit that is likely to produce an output signal of "1" and a circuit that is likely to produce an output signal of "0" depending on the terminal to which the metastable state "m" is applied.

Figure 13:
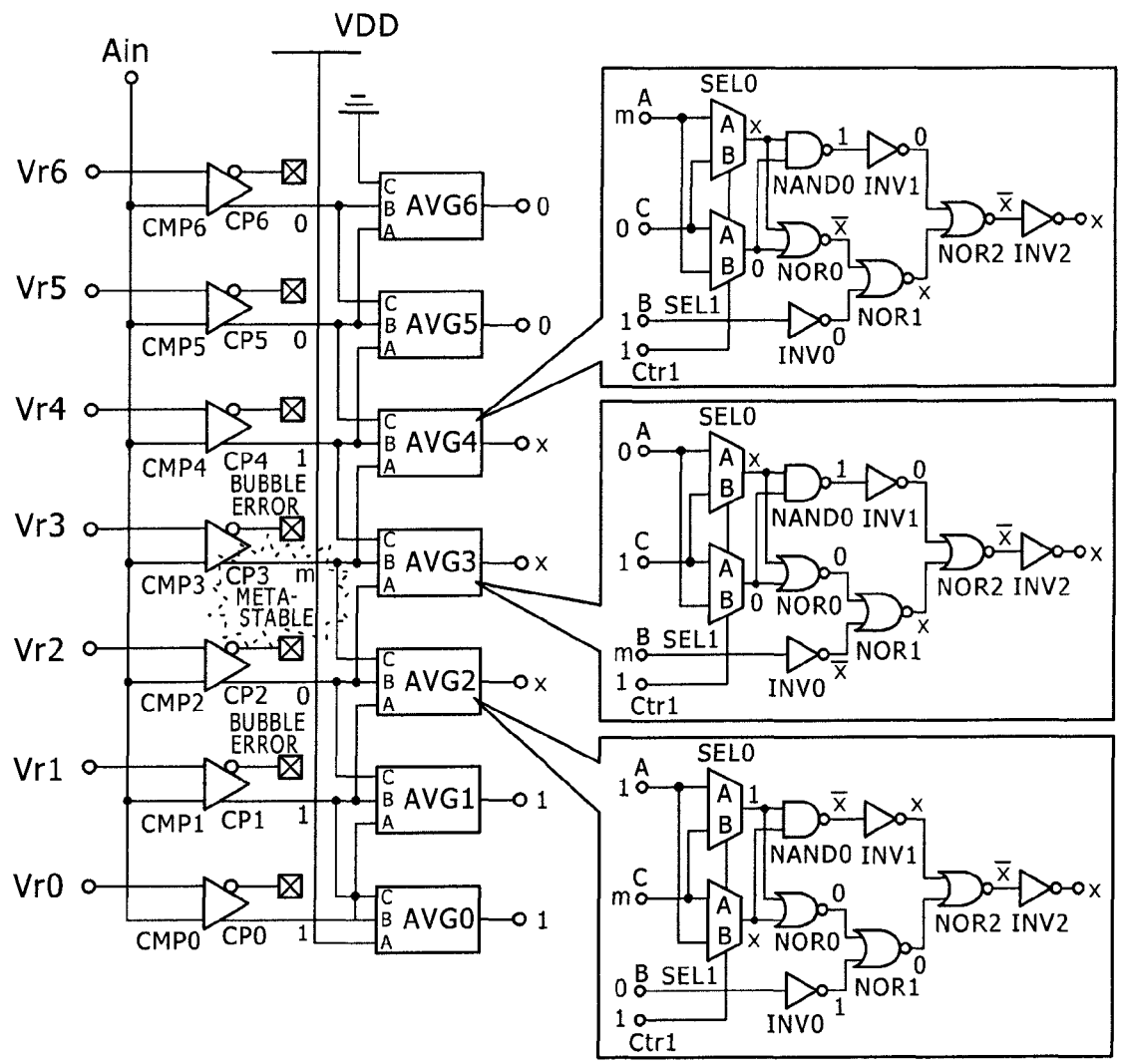
FIG. 13 is a block diagram of the majority circuit showing paths along which an indefinite value "x" due to a metastable state is propagated as "1" is stacked from a low-order bit.
Figure 14:
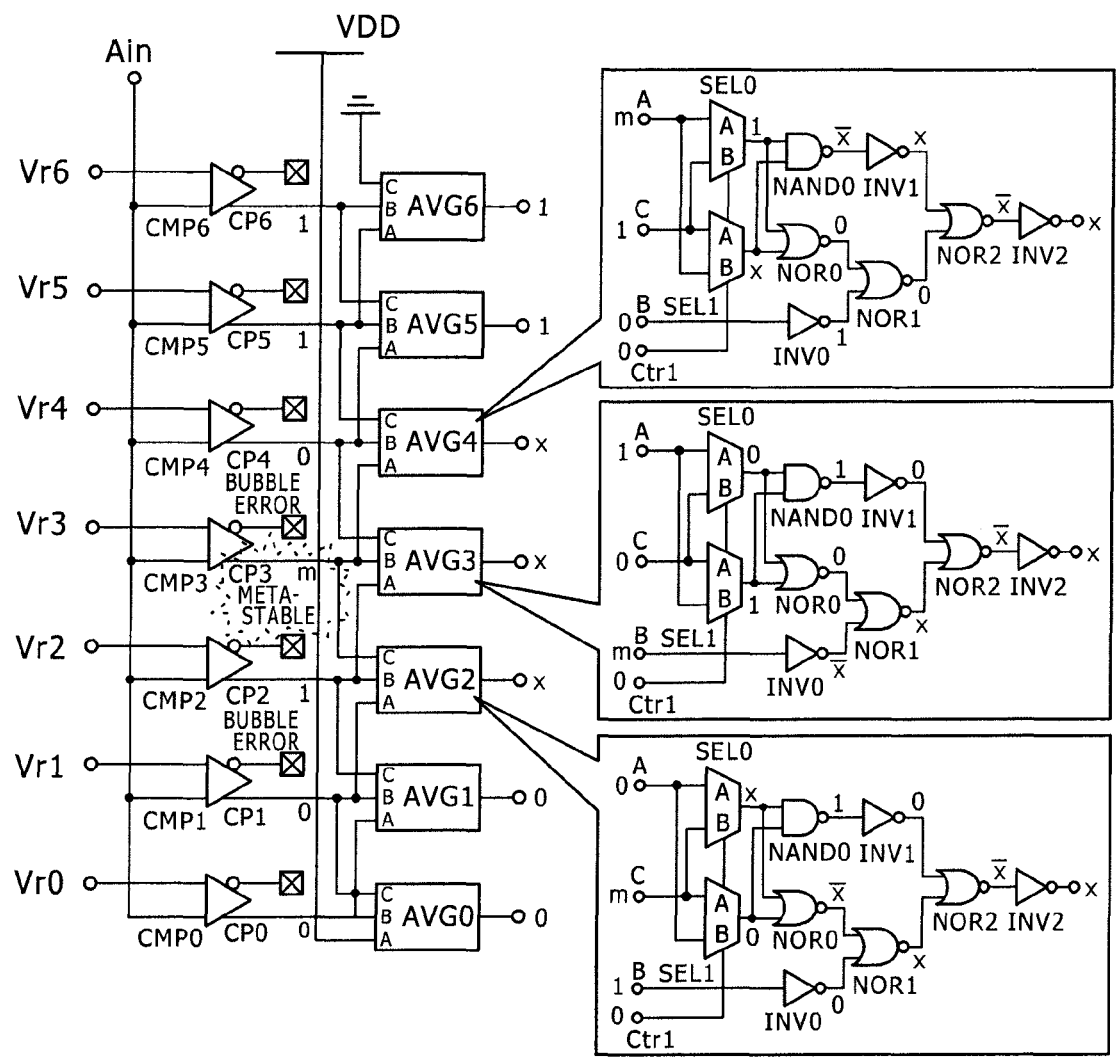
FIG. 14 is a block diagram of the majority circuit showing paths along which an indefinite value "x" due to a metastable state is propagated as "0" is stacked from a low-order bit.

FIG. 13 is a block diagram of the majority circuits showing paths along which an indefinite value "x" due to a metastable state is propagated when the control signal Ctrl is Ctrl=1. FIG. 14 is a block diagram of the majority circuits showing paths along which an indefinite value "x" due to a metastable state is propagated when the control signal Ctrl is Ctrl=0.

As shown in FIG. 13, when the control signal Ctrl is Ctrl=1, it represents the mode in which "1" is stacked from the low-order bit. In the majority circuit AVG2, "x" is propagated along a path from the NAND gate NAND0 to the inverter INV1 to the NOR gate NOR2 to the inverter INV2 subsequently to the selector. When the control signal Ctrl is Ctrl=1, since the input signal applied to the terminal A of the selector is output from the selector, the input signal applied to the terminal A of the majority circuit AVG2 is input to the NAND gate NAND0, and the input signal applied to the terminal C of the majority circuit AVG2 is input to the NOR gate NOR0. Therefore, "x" is propagated through the selector SEL1 in the majority circuit AVG2, along a path from the NAND gate NAND10 to the NAND gate NAND12 to the NAND gate NAND0 to the inverter INV1 to the NOR gate NOR2 to the inverter INV2.

Similarly, in the majority circuit AVG4, "x" is propagated along a path from the NOR gate NOR0 to the NOR gate NOR1 to the NOR gate NOR2 to the inverter INV2 subsequently to the selector. When the control signal Ctrl is Ctrl=1, since the input signal applied to the terminal A of the selector is input to the NAND gate NAND0, and the input signal applied to the terminal C of the majority circuit AVG4 is input to the NOR gate NOR0, "x" is propagated through the selector SEL0 in the majority circuit AVG4, along a path from the NAND gate NAND10 to the NAND gate NAND12 to the NOR gate NOR0 to the NOR gate NOR1 to the NOR gate NOR2 to the inverter INV2.

In the mode wherein "1" is stacked, therefore, in order for the majority circuit AVG2 to be likely to produce an output signal of "1," the NAND gate NAND 10 of the selector SEL1 through which "x" is propagated may have its logic threshold value lowered, i.e., may have the ratio $W_n/L_n$ smaller than the ratio $W_p/L_p$.

Similarly, in order for the majority circuit AVG4 to be likely to produce an output signal of "0," the NAND gate NAND 10 of the selector SEL0 through which "x" is propagated may have its logic threshold value increased, i.e., may have the ratio $W_p/L_p$ increased.

When "0" is stacked from the low-order bit (Ctrl=1), as shown in FIG. 14, "x" is propagated through the selector SEL0 in the majority circuit AVG2, along a path from the NAND gate NAND11 to the NAND gate NAND12 to the NOR gate NOR0 to the NOR gate NOR1 to the NOR gate NOR2 to the inverter INV2. In the mode wherein "0" is stacked, therefore, in order for the majority circuit AVG2 to be likely to produce an output signal of "0," the NAND gate NAND 11 of the selector SEL0 may have the ratio $W_p/L_p$ increased.

Similarly, when "0" is stacked from the low-order bit (Ctrl=1), as shown in FIG. 14, "x" is propagated through the selector SEL1 in the majority circuit AVG4, along a path from the NAND gate NAND11 to the NAND gate NAND12 to the NAND gate NAND0 to the inverter INV1 to the NOR gate NOR2 to the inverter INV2. In the mode wherein "0" is stacked, therefore, in order for the majority circuit AVG4 to be likely to produce an output signal of "0," the NAND gate NAND 11 of the selector SEL1 may have the ratio $W_n/L_n$ increased.

Figure 15:
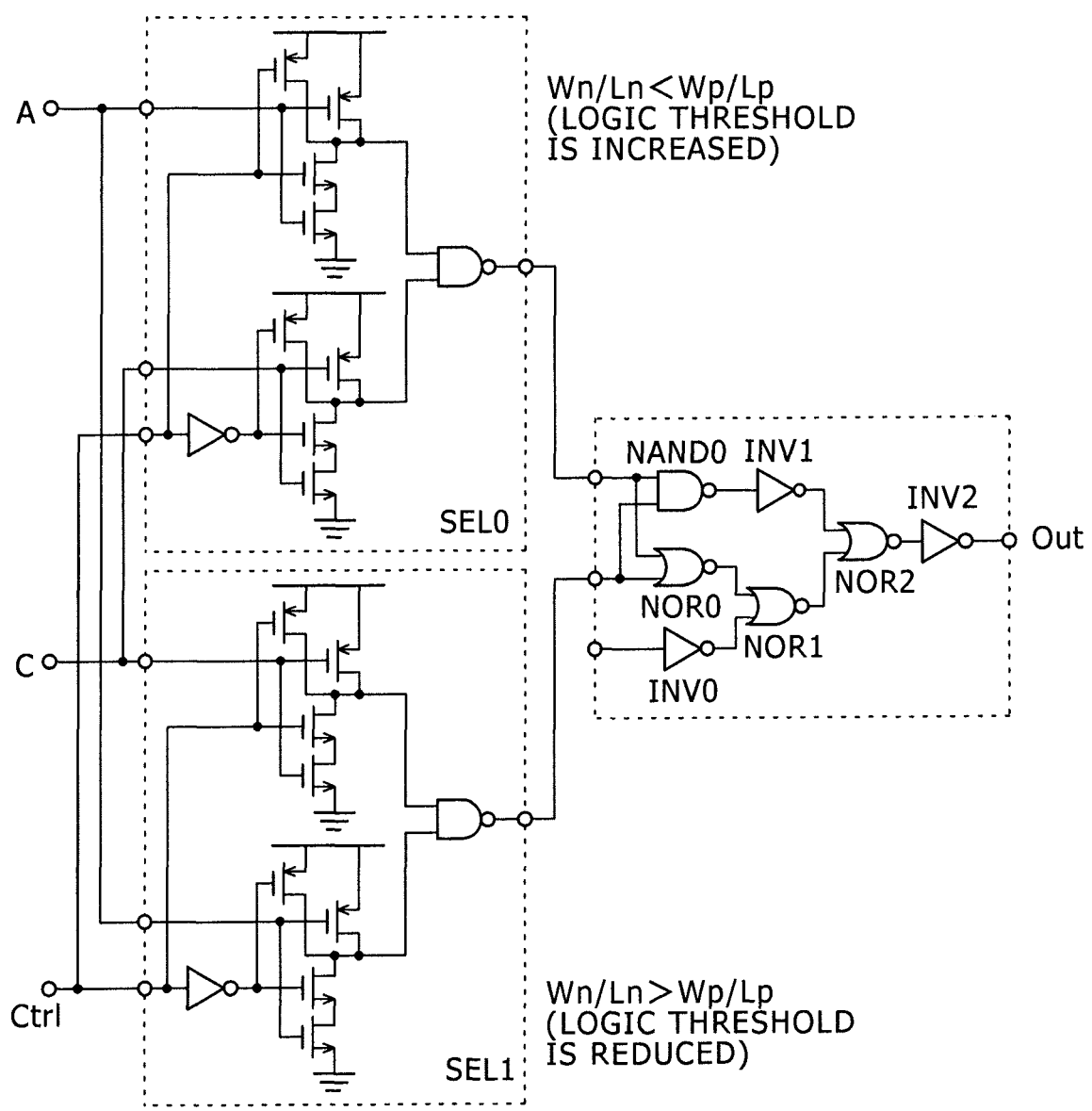
FIG. 15 is a circuit diagram showing in detail a majority circuit for a cyclic thermometer code.

FIG. 15 is a circuit diagram showing in detail the majority circuit for the cyclic thermometer code, with the selectors SEL0, SEL1 at a gate level. In the selector SEL0, the ratio $W_p/L_p$ may be increased to increase the logic threshold value of the NAND gate NAND10, and the ratio $W_p/L_p$ of the NAND gate NAND11 may be increased. In the selector SEL1, the ratio $W_n/L_n$ may be increased to reduce the logic threshold value of the NAND gate NAND10, and the ratio $W_n/L_n$ of the NAND gate NAND11 may be increased.

If the high-order bit is used as the control signal Ctrl for the selectors, then since the high-order bit after it is inverted is the same as the low-order bit, an inverting circuit may be inserted in series in the path for supplying the high-order bit and may invert the high-order bit into the control signal Ctrl. Alternatively, the inverter INV10 included in each of the selectors SEL0, SEL1 as shown in FIG. 12 may be connected to the path for supplying the high-order bit to the NAND gate NAND10 and may invert the high-order bit into the control signal Ctrl.

The selectors SEL0, SEL1 are not limited to the circuit arrangement shown in FIG. 12. If another circuit is used as each of the selectors SEL0, SEL1, a path for propagating the indefinite value "x" may be determined and the logic threshold value of a gate on the path may be adjusted for achieving the same advantages as described above.

If each of the selectors SEL0, SEL1 is constructed of switches rather than a combination of logic gates, then since such a selector does not have a gain for converting a metastable state "m" into a simple indefinite state "x," the metastable state "m" is input to the next majority circuit. In this case, the majority circuit shown in FIG. 5 may be employed.

Figure 16:
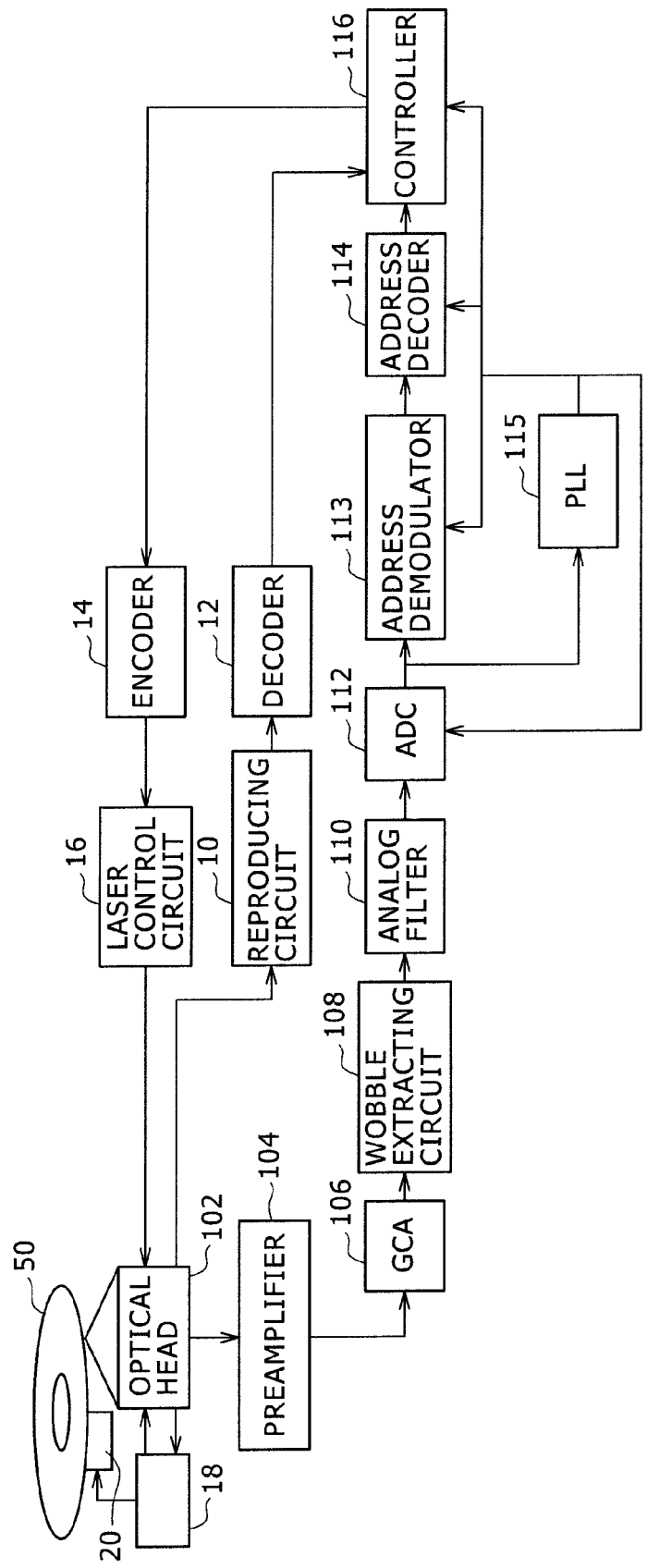
FIG. 16 is a block diagram of an optical disk device incorporating an A/D converter according to the present embodiment.

FIG. 16 is a block diagram of an optical disk device incorporating the A/D converter according to the present embodiment. The optical disk device includes a wobble signal processing system. The wobble signal processing system includes an optical head (optical pickup) 102 for reading tracks of a disk-shaped recording medium 50, a preamplifier 104, a GCA (Gain Control Amplifier) 106, a wobble extracting circuit 108, an analog filter 110, an A/D converter (ADC) 112, an address demodulator 113, an address decoder 114, a PLL (Phase Locked Loop) 115, and a controller 116.

To the optical head 102, there is connected a reproducing circuit 10 for processing, e.g., filtering and digitizing, a reproduced signal detected from the disk-shaped recording medium 50. The reproducing circuit 10 is connected to a decoder 12 for converting the data format of the reproduced signal. The optical head 102, the reproducing circuit 10, and the decoder 12 jointly make up a signal processing system.

Information to be recorded on the disk-shaped recording medium 50 is sent from the controller 116 to an encoder 14 for converting the data format of the information. Depending on the bits of the information to be recorded, a laser control circuit 16 controls the light emission of a light source in the optical head 102 for writing the information on the disk-shaped recording medium 50. The encoder 14, the laser control circuit 16, and the optical head 102 jointly make up a signal recording system.

The optical head 102 includes a photodetector for detecting a signal from the disk-shaped recording medium 50. The signal detected by the photodetector is processed into a servo signal that is applied to a servo circuit 18, which control the position of the optical head 102 based on the servo signal. The servo circuit 18 also control the rotation of a spindle motor 20 to control the rotation of the disk-shaped recording medium 50 which is rotated by the spindle motor 20.

The disk-shaped recording medium 50 includes an optical disk having wobbling tracks formed on a recording surface thereof. The optical head 102 includes a light source such as a laser diode, an objective lens for focusing a laser beam emitted by the light source, a photodetector for detecting a laser beam reflected from the disk-shaped recording medium 50, an optical system for guiding the reflected laser beam to the photodetector, and an actuator for performing focusing servo and tracking servo operation.

The wobble signal processing system operates as follows: A signal read from the disk-shaped recording medium 50 by the optical head 102 is output from the optical head 102 and amplified by the preamplifier 104. The amplified signal is then adjusted in amplitude to the dynamic range of subsequent circuits. Then, a wobble signal is extracted from the signal by the wobble extracting circuit 108 and supplied to the analog filter 110. The analog filter 110 removes unwanted low- and high-range signal components from the supplied wobble signal. The wobble signal is then input to the A/D converter 112, which converts the signal into a digital wobble signal. The digital wobble signal output from the A/D converter 112 is input to the address demodulator 113, which detects a modulated signal from the wobble signal for address demodulation and outputs the demodulated signal to the address decoder 114. The address decoder 114 decodes the demodulated signal into an address representative of the accessed position and outputs the address to the controller 116. Based on the supplied address, the controller 116 controls the signal reproducing system and the signal recording system of the optical disk device. The PLL 115 generates a clock signal used by the A/D converter 112, the address demodulator 113, the address decoder 114, and the controller 116.

The A/D converter according to the present embodiment can be used as an A/D converter for reading data which is included in the reproducing circuit 10, for example, and also as the A/D converter 112 in the wobble signal processing system. Since the A/D converter according to the present embodiment lends itself to high-speed operation because it can output a highly accurate binary signal even if it is brought into a metastable state, the A/D converter is applicable to optical disk devices.

According to the present embodiment, as described above, it is possible to greatly reduce an error contained in the output code of the A/D converter due to a metastable state of the comparators. Even if a minimum overdrive voltage which serves as a rough indication of how small a potential detectable by the comparators can be is increased, thereby increasing the possibility of a metastable state, a resulting error can reliably be corrected. Accordingly, an MCL can be of a low power requirement and can be mounted in a small area.

It should be understood by those skilled in the art that various modifications, combinations, sub-combinations and alterations may occur depending on design requirements and other factors insofar as they are within the scope of the appended claims or the equivalents thereof.

What is claimed is:

1. An analog/digital converter comprising:
a plurality of comparators for comparing a plurality of respective standard voltages with an analog input value, the comparators being arranged depending on magnitudes of the standard voltages;
a logic boundary detector for detecting a logic boundary point where output signals from the comparators change from one level to another level; and
a plurality of majority circuits for being supplied with the output signals from the comparators and determining output signals based on a majority vote from the comparators, the majority circuits having logic threshold values adjusted for respective input terminals thereof which are supplied with the output signals from the comparators.

2. The analog/digital converter according to claim 1, wherein each of the majority circuits comprises a plurality of metal oxide semiconductor transistors, and each of the logic threshold values for the metal oxide semiconductor transistors is adjusted by changing the ratio of a channel width to a channel length of the metal oxide semiconductor transistors.

3. The analog/digital converter according to claim 1, wherein each of the majority circuits has three terminals which are supplied with respective output signals from three of the comparators, the logic threshold value for one of the three terminals which is supplied with the output signal from one of the three comparators which has an intermediate one of the standard voltages serves as a standard threshold value, the logic threshold value for one of the remaining two terminals which is supplied with the output signal from one of the remaining two comparators is set to a level lower than the standard threshold value, and the logic threshold value for the other of the remaining two terminals which is supplied with the output signal from the other of the remaining two comparators is set to a level higher than the standard threshold value.

4. The analog/digital converter according to claim 2, wherein each of the majority circuits includes a selector having terminals supplied with output signals from the remaining two comparators, the terminals of the selector being switchable depending on a high-order bit or a low-order bit of the output signals from the comparators.

5. The analog/digital converter according to claim 4, wherein each of the majority circuits comprises a plurality of metal oxide semiconductor transistors, and each of the logic threshold values is adjusted by changing the ratio of a channel width to a channel length of one of the metal oxide semiconductor transistors.

6. An information recording and reproducing apparatus comprising:
an optical pickup for applying a light beam to a track on an optical recording medium, the optical pickup having a photodetector for detecting a light beam reflected from the optical recording medium; and
a reproducing circuit for acquiring a reproduced signal from a signal representing the detected light beam from the photodetector;
the reproducing circuit including an analog/digital converter;
the analog/digital converter including
a plurality of comparators for comparing a plurality of respective standard voltages with an analog input value for a magnitude thereof, the comparators being arranged depending on magnitudes of the standard voltages;
a logic boundary detector for detecting a logic boundary point where output signals from the comparators change from one level to another level; and
a plurality of majority circuits supplied with the output signals from the comparators and determining output signals based on a majority vote on the output signals from the comparators, the majority circuits having logic threshold values adjusted for respective input terminals thereof which are supplied with the output signals from the comparators.

7. An information recording and reproducing apparatus comprising:
an optical pickup for applying a light beam to a track on an optical recording medium, the optical pickup having a photodetector for detecting a light beam reflected from the optical recording medium; and,
a wobble signal extracting circuit for acquiring a wobble signal from a signal representing the detected light beam from the photodetector;
the wobble signal extracting circuit including an analog/digital converter;
the analog/digital converter including
a plurality of comparators for comparing a plurality of respective standard voltages with an analog input value for a magnitude thereof, the comparators being arranged depending on magnitudes of the standard voltages;
a logic boundary detector for detecting a logic boundary point where output signals from the comparators change from one level to another level; and
a plurality of majority circuits supplied with the output signals from the comparators and determining output signals based on a majority vote on the output signals from the comparators, the majority circuits having logic threshold values adjusted for respective input terminals thereof which are supplied with the output signals from the comparators.

* * * * *